(12) United States Patent
Jeon et al.

(10) Patent No.: US 12,419,181 B2
(45) Date of Patent: Sep. 16, 2025

(54) DISPLAY APPARATUS AND MULTI-SCREEN DISPLAY APPARATUS INCLUDING THE SAME

(71) Applicant: LG Display Co., Ltd., Seoul (KR)

(72) Inventors: YoungHo Jeon, Paju-si (KR); Yuseok Jung, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 470 days.

(21) Appl. No.: 18/066,809

(22) Filed: Dec. 15, 2022

(65) Prior Publication Data

US 2023/0200161 A1   Jun. 22, 2023

(30) Foreign Application Priority Data

Dec. 17, 2021   (KR) ........................ 10-2021-0181823

(51) Int. Cl.
*H01L 29/08*   (2006.01)
*H01L 25/10*   (2006.01)
*H10K 50/824*   (2023.01)
*H10K 59/131*   (2023.01)
*H10K 59/88*   (2023.01)

(52) U.S. Cl.
CPC ......... *H10K 59/131* (2023.02); *H01L 25/105* (2013.01); *H10K 50/824* (2023.02); *H10K 59/88* (2023.02)

(58) Field of Classification Search
CPC .... H10K 59/88; H10K 59/131; H10K 50/824; H01L 25/105

USPC ........................................................ 257/40
See application file for complete search history.

(56) References Cited

FOREIGN PATENT DOCUMENTS

KR   20140080231 A   *   6/2014
KR   20210097248 A   *   9/2021

OTHER PUBLICATIONS

Cite the machine translation Jo D (KR-20140080231-A).*
Cite the machine translation Moon S (KR-20210097248-A).*

* cited by examiner

*Primary Examiner* — Phuc T Dang
(74) *Attorney, Agent, or Firm* — SEED INTELLECTUAL PROPERTY LAW GROUP LLP

(57) ABSTRACT

A display apparatus having a thin bezel width while preventing non-uniform luminance of an image from occurring and a multi-screen display apparatus including the same are provided. The display apparatus includes a substrate having a display portion, a plurality of pixels disposed in the display portion, a common electrode disposed in the display portion and electrically connected to each of the plurality of pixels, an auxiliary electrode electrically connected to an auxiliary voltage line extended from an edge portion of the substrate to the display portion, a height control layer provided between the substrate and the auxiliary electrode, and an auxiliary electrode contact portion disposed between the plurality of pixels, wherein the common electrode may be in contact with the auxiliary electrode covering a side of the height control layer in the auxiliary electrode contact portion.

20 Claims, 11 Drawing Sheets

DISPLAY APPARATUS AND MULTI-SCREEN DISPLAY APPARATUS INCLUDING THE SAME

CROSS-REFERENCE TO RELATED APPLICATIONS

This application claims the benefit of the Korean Patent Application No. 10-2021-0181823 filed on Dec. 17, 2021, which is hereby incorporated by reference as if fully set forth herein.

BACKGROUND

Technical Field

The present disclosure relates to a display apparatus for displaying an image and a multi-screen display apparatus including the same.

Description of the Related Art

With the advancement of the information age, the demand for a display apparatus for displaying an image has increased in various forms. Therefore, various types of display apparatuses such as a liquid crystal display (LCD) apparatus, a plasma display panel (PDP) apparatus, an organic light emitting display (OLED) apparatus and a quantum dot light emitting display (QLED) apparatus have been recently used.

Among the display apparatuses, the organic light emitting display (OLED) apparatus and the quantum dot light emitting display (QLED) apparatus are self-light emitting types and have advantages in that a viewing angle and a contrast ratio are more excellent than those of the liquid crystal display (LCD) apparatus. Also, since the organic light emitting display (OLED) apparatus and the quantum dot light emitting display (QLED) apparatus do not require a separate backlight, it is advantageous that the organic light emitting display (OLED) apparatus and the quantum dot light emitting display (QLED) apparatus are able to be thin and lightweight and have low power consumption.

The organic light emitting display apparatus may be categorized into a top emission mode and a bottom emission mode depending on a transmissive direction of light that is emitted, wherein the bottom emission mode has high stability and high degree of freedom in process but has limitation in an aperture ratio. In this respect, studies for the top emission mode having a high aperture ratio are actively ongoing.

BRIEF SUMMARY

In case of the top emission mode organic light emitting display apparatus in the related art, a light emitting layer disposed between a pixel electrode and a common electrode operates by a voltage applied from the pixel electrode and the common electrode. In this case, since light emitted from the light emitting layer should pass through the common electrode disposed at an upper side, the common electrode is formed to be thin so as to have transparent metal or semi-transmissive properties. However, when the common electrode is formed to be thin, resistance is increased, whereby a problem occurs in that luminance of an edge portion of the display apparatus, to which a common voltage is supplied (or introduced), and luminance of a central portion of the display apparatus, which is away from the edge portion, become non-uniform.

Meanwhile, the organic light emitting display apparatus of the related art requires a bezel (or mechanism) for covering a bezel area disposed on an edge (or edge portion) of a display panel for displaying an image, and a bezel width may be increased due to a width of the mechanism.

Recently, a multi-screen display apparatus that implements a large screen by arranging a plurality of display apparatuses in a grid shape has been commercialized. However, in the multi-screen display apparatus of the related art, a boundary portion called a seam exists between adjacent display apparatuses due to a bezel area or bezel of each of the display apparatuses. This boundary portion reduces immersion of an image by giving a sense of disconnection (or discontinuity) of the image when displaying one image on an entire screen of the multi-screen display apparatus.

The present disclosure has been formed in view of the various technical problems in the related art including above identified problems. One or more embodiments of the present disclosure provide a display apparatus having a thin bezel width while preventing non-uniform luminance of an image from occurring and a multi-screen display apparatus including the same.

In addition to the technical benefits of the present disclosure as mentioned above, additional benefits and features of the present disclosure will be clearly understood by those skilled in the art from the following description of the present disclosure.

In accordance with an aspect of the present disclosure, the above and other objects can be accomplished by the provision of a display apparatus comprising a substrate having a display portion, a plurality of pixels disposed in the display portion, a common electrode disposed in the display portion and electrically connected to each of the plurality of pixels, an auxiliary electrode electrically connected to an auxiliary voltage line extended from an edge portion of the substrate to the display portion, a height control layer provided between the substrate and the auxiliary electrode, and an auxiliary electrode contact portion disposed between the plurality of pixels, wherein the common electrode may be in contact with the auxiliary electrode covering a side of the height control layer in the auxiliary electrode contact portion.

In accordance with another aspect of the present disclosure, the above and other objects can be accomplished by the provision of a multi-screen display apparatus comprising a plurality of display modules disposed along at least one of a first direction and a second direction crossing the first direction, wherein each of the plurality of display modules includes a substrate having a display portion, a plurality of pixels disposed in the display portion, a common electrode disposed in the display portion and electrically connected to each of the plurality of pixels, an auxiliary electrode electrically connected to an auxiliary voltage line extended from an edge portion of the substrate to the display portion, a height control layer provided between the substrate and the auxiliary electrode, and an auxiliary electrode contact portion disposed between the plurality of pixels, wherein the common electrode may be in contact with the auxiliary electrode covering a side of the height control layer in the auxiliary electrode contact portion.

Details according to various embodiments of the present disclosure in addition to the above objects are included in the detailed description and drawings.

BRIEF DESCRIPTION OF THE SEVERAL VIEWS OF THE DRAWINGS

The above and other objects, features and other advantages of the present disclosure will be more clearly understood from the following detailed description taken in conjunction with the accompanying drawings, in which.

DETAILED DESCRIPTION

Figure 1:
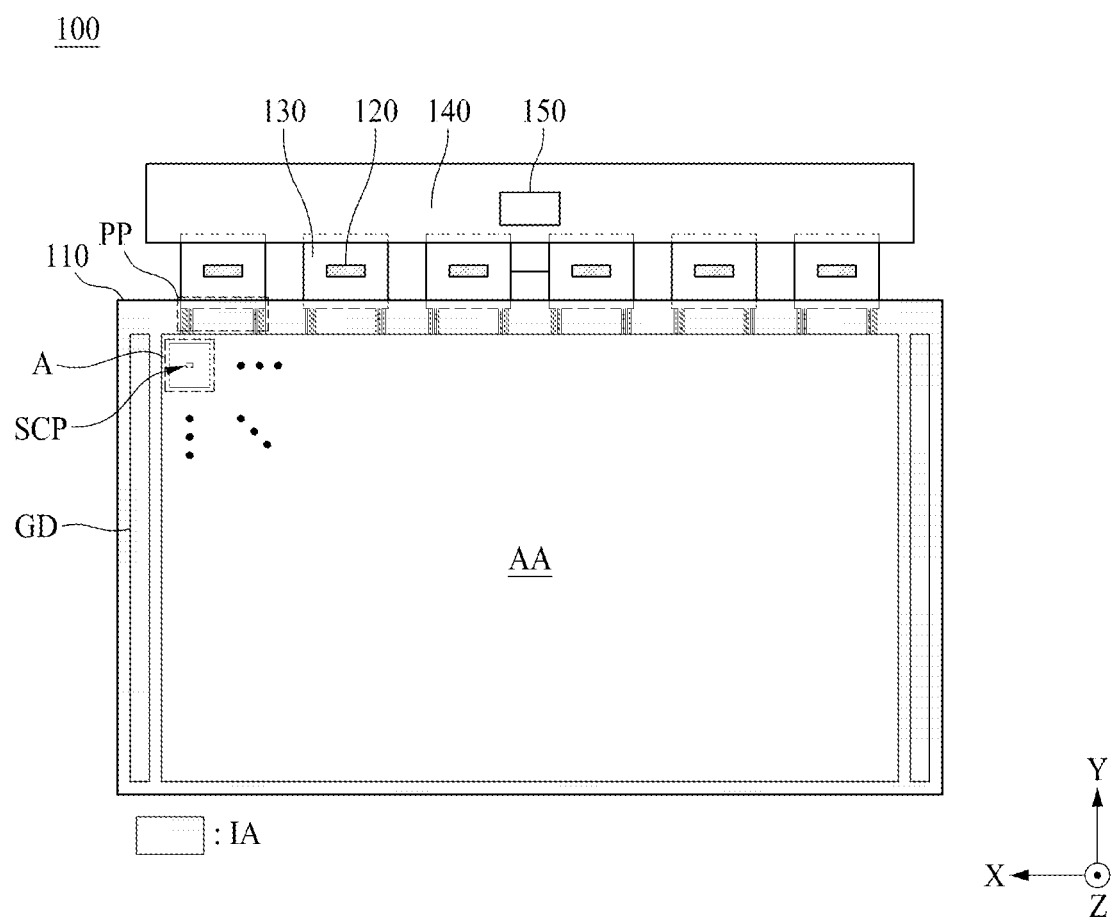
FIG. 1 is a view illustrating a display apparatus according to one embodiment of the present disclosure.

Reference will now be made in detail to the embodiments of the present disclosure, examples of which are illustrated in the accompanying drawings. Wherever possible, the same reference numbers will be used throughout the drawings to refer to the same or like parts. Advantages and features of the present disclosure, and implementation methods thereof will be clarified through following embodiments described with reference to the accompanying drawings. The present disclosure may, however, be embodied in different forms and should not be construed as limited to the embodiments set forth herein.

Rather, these embodiments are provided so that this disclosure will be thorough and complete, and will fully convey the scope of the present disclosure to those skilled in the art.

A shape, a size, dimension (e.g., length, width, height, thickness, radius, diameter, area, etc.), a ratio, an angle, and a number of elements disclosed in the drawings for describing embodiments of the present disclosure are merely an example, and thus, the present disclosure is not limited to the illustrated details. Like reference numerals refer to like elements throughout.

A dimension including size and a thickness of each component illustrated in the drawing are illustrated for convenience of description, and the present disclosure is not limited to the size and the thickness of the component illustrated, but it is to be noted that the relative dimensions including the relative size, location, and thickness of the components illustrated in various drawings submitted herewith are part of the present disclosure.

In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a temporal relationship, for example, when the temporal order is described as "after," "subsequent," "next," and "before," a case which is not continuous may be included, unless "just" or "direct" is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

"X-axis direction", "Y-axis direction" and "Z-axis direction" should not be construed by a geometric relation only of a mutual vertical relation and may have broader directionality within the range that elements of the present disclosure may act functionally.

The term "at least one" should be understood as including any and all combinations of one or more of the associated listed items. For example, the meaning of "at least one of a first item, a second item and a third item" denotes the combination of all items proposed from two or more of the first item, the second item and the third item as well as the first item, the second item or the third item.

Features of various embodiments of the present disclosure may be partially or overall coupled to or combined with each other and may be variously inter-operated with each other and driven technically as those skilled in the art can sufficiently understand. The embodiments of the present disclosure may be carried out independently from each other or may be carried out together in co-dependent relationship.

Hereinafter, a preferred embodiment of a display apparatus and a multi-screen display apparatus including the same according to various embodiments of the present disclosure will be described in detail with reference to the accompanying drawings. In the drawings, the same or similar elements are denoted by the same reference numerals even though they are depicted in different drawings. Since a scale of each of elements shown in the accompanying drawings is different from an actual scale for convenience of description, the present disclosure is not limited to the shown scale.

Figure 2:
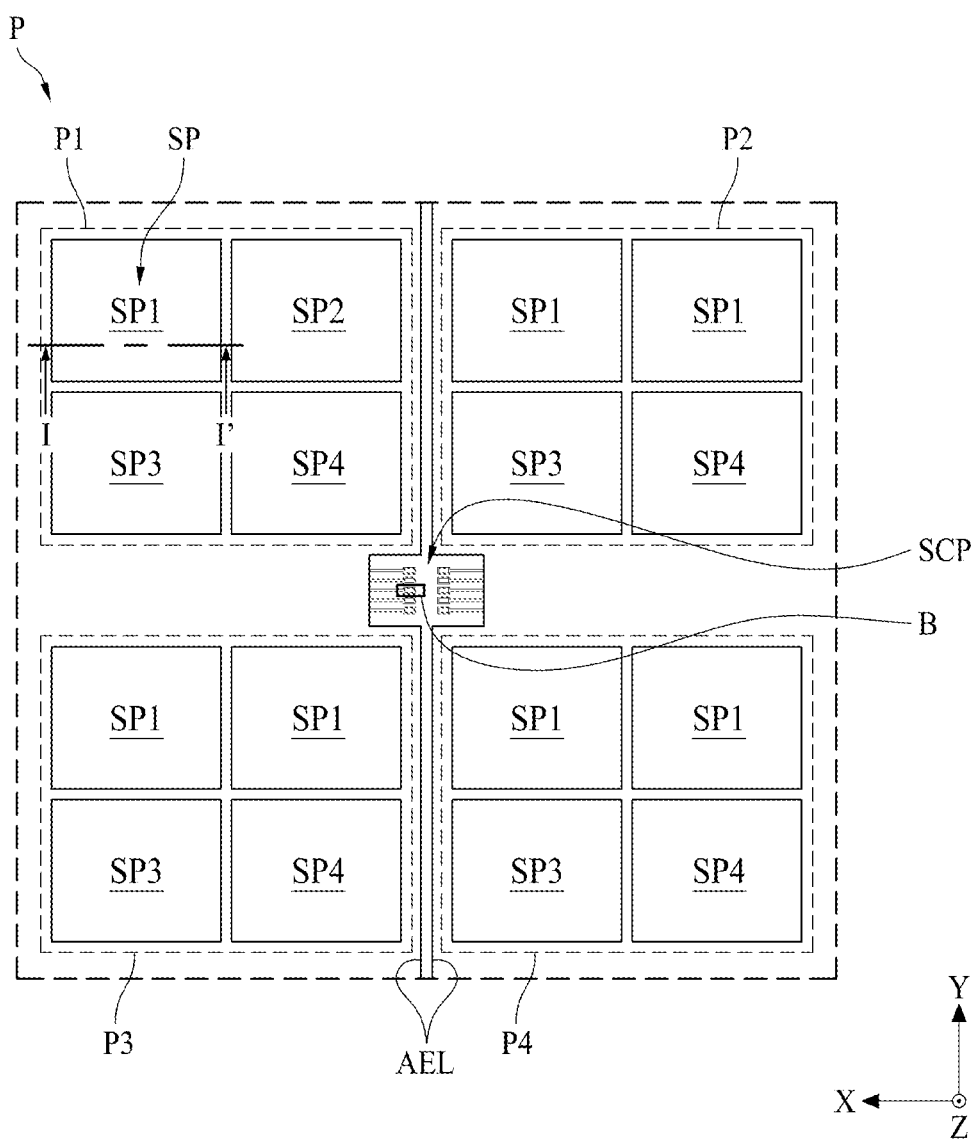
FIG. 2 is an enlarged view illustrating a portion A shown in FIG. 1.
Figure 3:
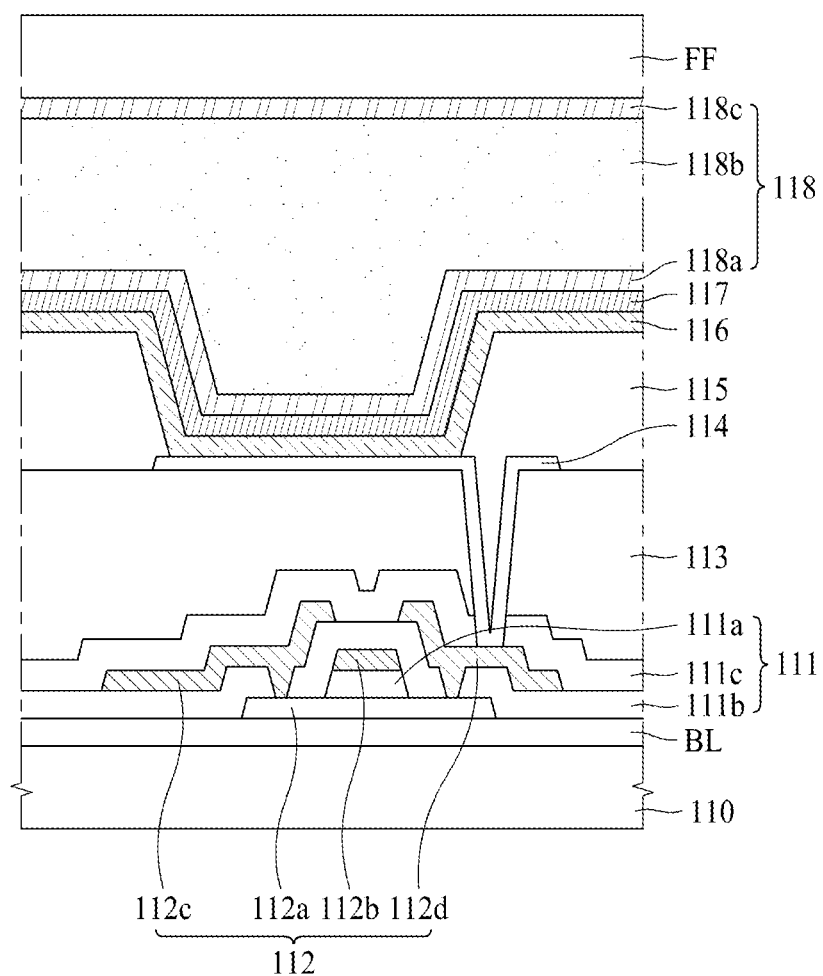
FIG. 3 is a cross-sectional view taken along line I-I' shown in FIG. 2.
Figure 4:
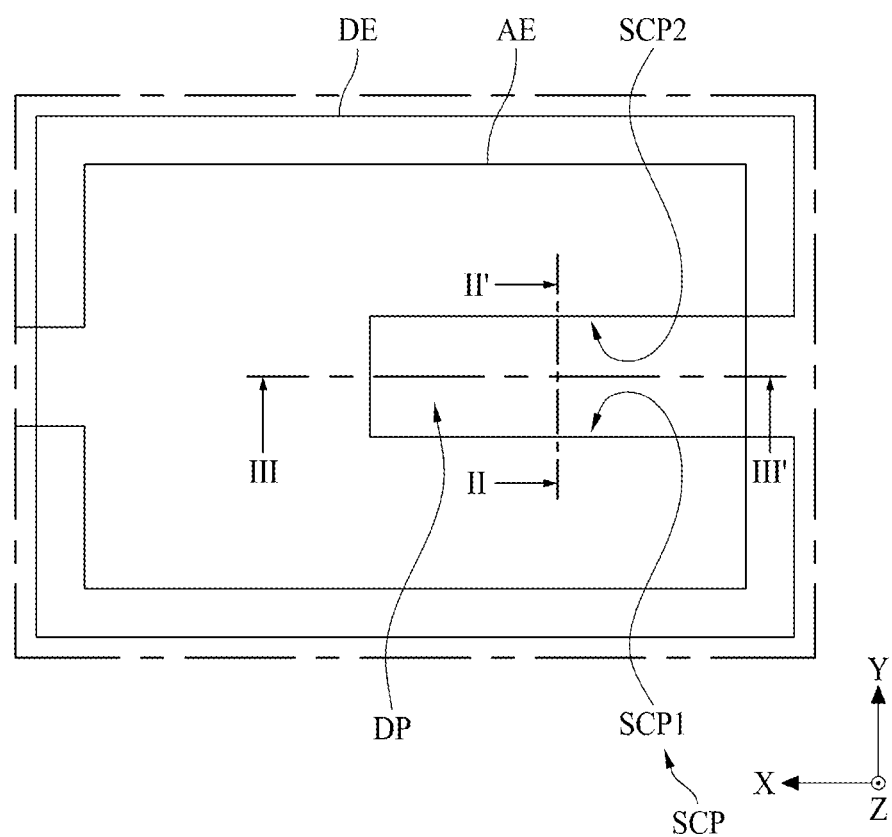
FIG. 4 is an enlarged view illustrating a portion B shown in FIG. 2.
Figure 5A:
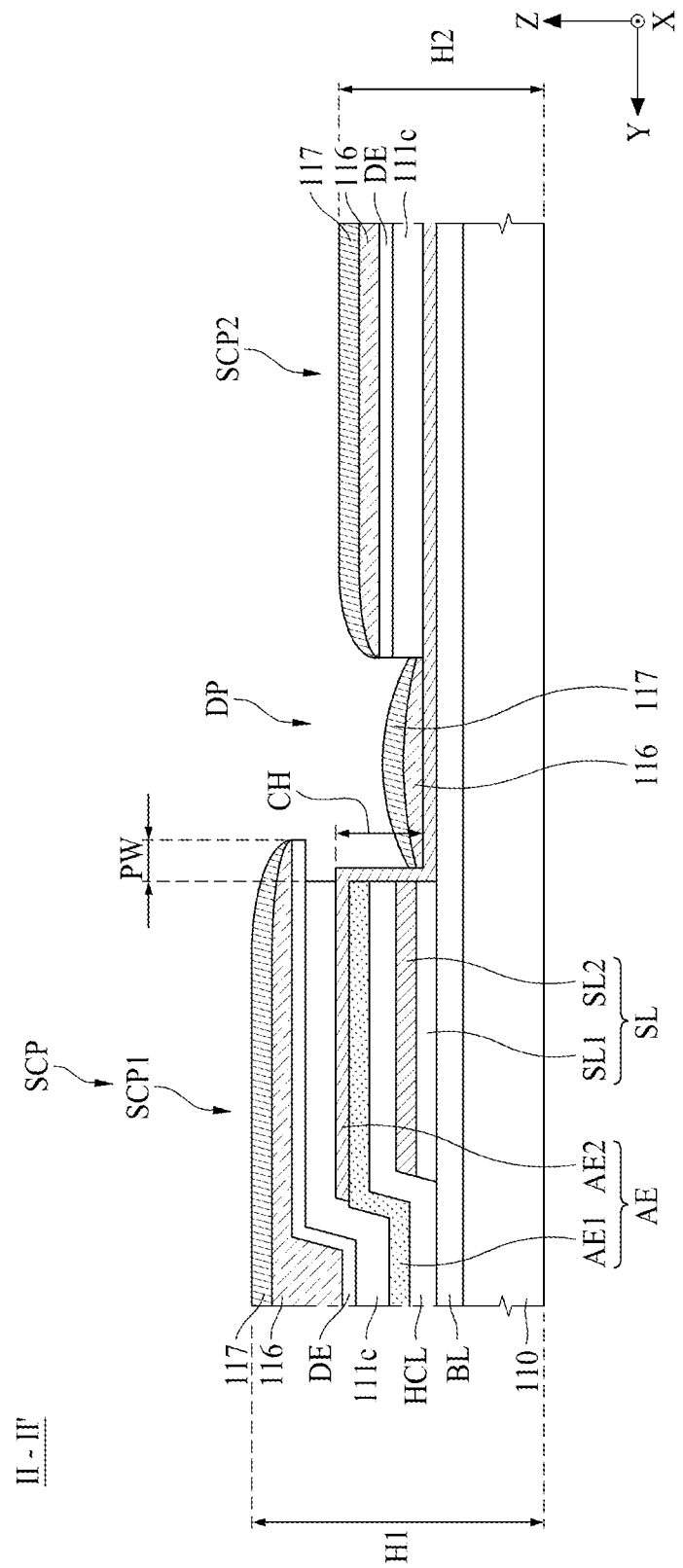
FIG. 5a is a cross-sectional view taken along line II-II' shown in FIG. 4.
Figure 5B:
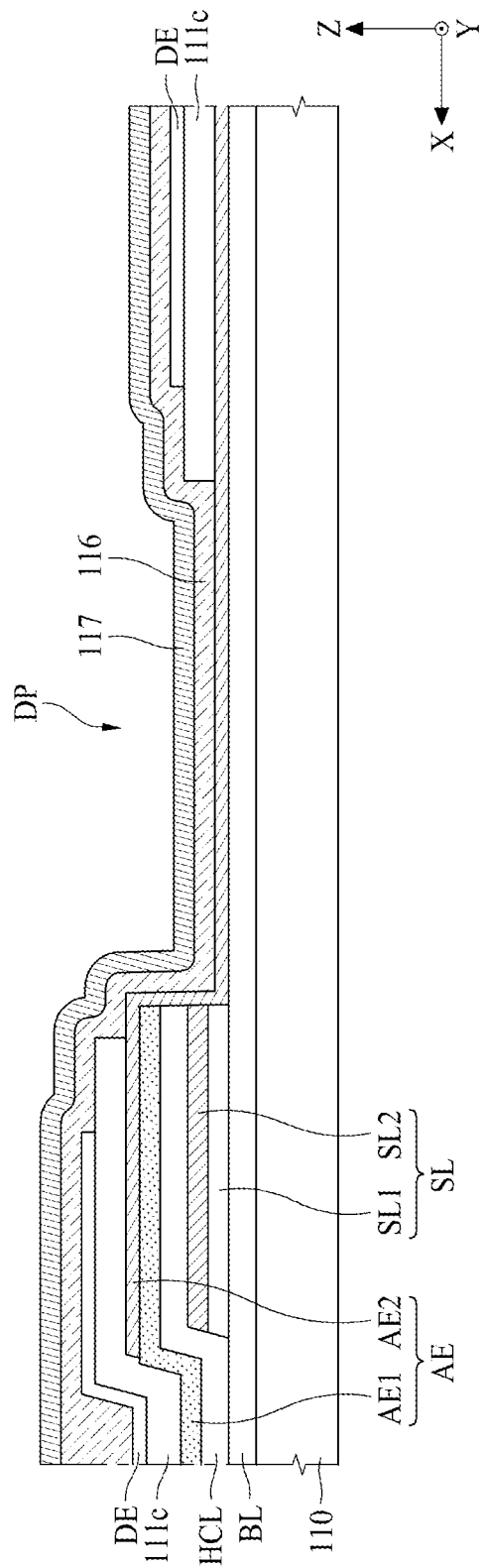
FIG. 5b is a cross-sectional view taken along line III-III' shown in FIG. 4.

FIG. 1 is a view illustrating a display apparatus according to one embodiment of the present disclosure, FIG. 2 is an enlarged view illustrating a portion A shown in FIG. 1, FIG. 3 is a cross-sectional view taken along line I-I' shown in FIG. 2, FIG. 4 is an enlarged view illustrating a portion B shown in FIG. 2, FIG. 5a is a cross-sectional view taken along line II-IP shown in FIG. 4, and FIG. 5b is a cross-sectional view taken along line III-III' shown in FIG. 4.

Referring to FIGS. 1 to 5b, a display apparatus 100 according to one embodiment of the present disclosure may include a substrate 110, a source drive integrated circuit (IC) 120, a flexible film 130, a circuit board 140, and a timing controller 150.

A display apparatus 100 according to one example may include a substrate 110 having a display portion AA, a plurality of pixels P disposed in the display portion AA, a common electrode 117 (shown in FIG. 3) disposed in the display portion and electrically connected to each of the plurality of pixels P, an auxiliary electrode AE connected to a pad portion PP disposed at an edge portion of the substrate and is electrically connected to an auxiliary voltage line AEL extending to the display portion AA, a height control layer HCL provided between the substrate 110 and the auxiliary electrode AE, and an auxiliary electrode contact portion SCP disposed between the plurality of pixels P. The common electrode 117 may be in contact with the auxiliary electrode AE covering a side of the height control layer HCL in the auxiliary electrode contact portion SCP.

Therefore, in the display apparatus 100 according to one embodiment of the present disclosure, since a common voltage may be applied to the common electrode 117 even at a central portion of the display portion AA through the auxiliary electrode contact portion SCP (or the auxiliary electrode AE) provided inside the display portion AA, non-uniform luminance at the central portion and the edge portion of the substrate 110 may be prevented from occurring.

Hereinafter, the display apparatus 100 according to one embodiment of the present disclosure will be described in detail with reference to FIGS. 1 to 5b.

The substrate 110 may include a lower substrate and an upper substrate, which are bonded to each other. The lower substrate may include a gate driver GD, but is not limited thereto. The substrate 110 may have a structure in which a film is covered on a single substrate rather than a bonding substrate.

The substrate 110 may be a glass substrate, or may be a thin type glass substrate or plastic substrate, which may be bent or curved. The substrate 110 may include a display portion AA, and a non-display portion IA surrounding the display portion AA. The display portion AA may further include a plurality of pixels P, each of which includes a plurality of subpixels SP, and a thin film transistor 112.

The plurality of pixels P according to one example may include at least three of first to fourth pixels P1, P2, P3 and P4 disposed to be adjacent to each other in the display portion AA. Each of the first to fourth pixels P1, P2, P3 and P4 may be provided to have at least three of the first to fourth subpixels SP1, SP2, SP3 and SP4.

The display portion AA is an area where an image is displayed, and may be a pixel array area, an active area, a pixel array unit, a display unit or a screen. For example, the display portion AA may be disposed at a portion other than an edge portion of the substrate 110.

The non-display portion IA may be a non-light emission area in which an image is not displayed, and may be also expressed as a non-display area, a non-active area or a non-active portion. For example, the non-display portion IA may be disposed at an edge portion of the substrate 110. The non-display portion IA may include a pad portion PP. A plurality of auxiliary voltage lines AEL for supplying a common voltage for driving the plurality of pixels P may be connected to the pad portion PP. The auxiliary voltage line AEL according to one example may be extended from the edge portion (or the non-display portion IA) of the substrate 110 to the display portion AA. The auxiliary voltage line AEL extended to the display portion AA may be electrically connected to the auxiliary electrode AE disposed on the substrate 110. Therefore, the auxiliary voltage line AEL may apply a common voltage supplied from the pad PP to the auxiliary electrode AE.

Each of the plurality of pixels P may be individually disposed in each of a plurality of pixel areas in the display portion AA. Each of the plurality of pixel areas may be defined based on the location of pixel driving lines disposed in the display portion AA, for example, a plurality of gate lines and a plurality of data lines.

Each of the plurality of pixels P is disposed in each pixel area on the substrate 110, and displays a color image corresponding to a gate signal supplied from an adjacent gate line and a data voltage supplied from an adjacent data line.

Each of the plurality of pixels P may include a plurality of subpixels SP adjacent to each other. The subpixel SP may be defined as an area of a minimum unit, in which light is actually emitted. For example, at least three subpixels adjacent to one another may constitute one pixel P or unit pixel P for displaying a color image.

The pixel P according to one example may include first to fourth subpixels SP arranged to be adjacent to one another along at least one of the first direction X and a second direction Y. In this case, the first subpixel may be a red subpixel, the second subpixel may be a white subpixel, the third subpixel may be a blue subpixel, and the fourth subpixel may be a green subpixel, but the present disclosure is not limited thereto.

According to one example, the light emitting element layers respectively disposed in the first to fourth subpixels SP may individually emit light of different colors or commonly emit white light.

When each of the first to fourth subpixels SP commonly emits white light, the first, third and fourth subpixels SP may include their respective color filters (or different wavelength conversion members) for converting white light into light of different colors. In this case, the second subpixel according to an example may not include a color filter. At least a portion of the second subpixel according to another example may include the same color filter as that of any one of the first, third and fourth subpixels.

The pixel P according to another example may include first to third subpixels SP arranged to be adjacent to one another along a first direction X. In this case, the first subpixel may be a red subpixel, the second subpixel may be a green subpixel, the third subpixel may be a blue subpixel, but the present disclosure is not limited thereto.

The source drive IC 120 receives digital video data and a source control signal from the timing controller 150. The source drive IC 120 converts the digital video data into analog data voltages in accordance with the source control signal and supplies the analog data voltages to the data lines. When the source drive IC 120 is manufactured as a driving chip, the source drive IC 120 may be packaged in the flexible film 130 in a chip on film (COF) method or a chip on plastic (COP) method.

Pads, such as data pads, may be formed in the edge portion of the substrate 110. Lines connecting the pads with the source drive IC 120 and lines connecting the pads with lines of the circuit board 140 may be formed in the flexible film 130. The flexible film 130 may be attached onto the pads by using an anisotropic conducting film, whereby the pads may be connected with the lines of the flexible film 130.

The circuit board 140 may be attached to the flexible films 130. A plurality of circuits implemented as driving chips may be packaged in the circuit board 140. For example, the timing controller 150 may be packaged in the circuit board 140. The circuit board 140 may be a printed circuit board or a flexible printed circuit board.

The timing controller 150 receives the digital video data and a timing signal from an external system board through a cable of the circuit board 140. The timing controller 150 generates a gate control signal for controlling an operation timing of the gate driver GD and a source control signal for controlling an operation timing of the source drive ICs 120 based on the timing signal. The timing controller 150 supplies the gate control signal to the gate driver GD, and supplies the source control signal to the source drive ICs 120.

Meanwhile, each of the subpixels SP supplies a predetermined current to an organic light emitting element according to a data voltage of the data line when a gate signal from the gate line is input using a thin film transistor. Therefore, a light emitting portion of each of the subpixels SP may emit light with predetermined brightness in accordance with the predetermined current.

Referring to FIG. 3, each of the first to fourth subpixels SP according to one example may include a circuit element layer 111 provided on an upper surface of a buffer layer BL, including a gate insulating layer 111a, an interlayer insulating layer 111b, a passivation layer 111c and a thin film transistor 112, a planarization layer 113 provided on the circuit element layer 111, a pixel electrode 114 provided on the planarization layer 113, a bank 115, an organic light emitting layer 116, a common electrode 117, and an encapsulation layer 118. The pixel electrode 114, the organic light emitting layer 116 and the common electrode 117 may be included in the light emitting element.

The buffer layer BL according to one example is provided on the substrate 110 to prevent water permeation to the thin film transistor 112. The buffer layer BL may be formed between the substrate 110 and the circuit element layer 111 (or gate insulating layer 111a) to protect the thin film transistor 112. The buffer layer BL may be disposed entirely on one surface (or front surface) of the substrate 110. The buffer layer BL may serve to prevent a material contained in the substrate 110 from diffusing into the transistor layer during a high temperature process of a manufacturing process of the thin film transistor.

The circuit element layer 111 may include a gate insulating layer 111a, an interlayer insulating layer 111b, a passivation layer 111c and a thin film transistor 112. The gate insulating layer 111a, the interlayer insulating layer 111b and the passivation layer 111c may be made of an inorganic material.

The thin film transistor 112 according to an example may include an active layer 112a, a gate electrode 112b, a source electrode 112c, and a drain electrode 112d.

The active layer 112a may include a channel area, a drain area and a source area, which are formed in a thin film transistor area of a circuit area of the pixel P. The drain area and the source area may be spaced apart from each other with the channel area interposed therebetween.

The active layer 112a may be formed of a semiconductor material based on any one of amorphous silicon, polycrystalline silicon, oxide and organic material.

The gate insulating layer 111a may be formed on the channel area of the active layer 112a. As an example, the gate insulating layer 111a may be formed in an island shape only on the channel area of the active layer 112a, or may be formed on an entire front surface of the first substrate 110 or the buffer layer BL, which includes the active layer 112a.

The gate electrode 112b may be formed on the gate insulating layer 111a to overlap the channel area of the active layer 112a.

The interlayer insulating layer 111b may be formed on the gate electrode 112b and the drain area and the source area of the active layer 112a. The interlayer insulating layer 111b may be formed in the circuit area and an entire light emission area, in which light is emitted to the pixel P. For example, the interlayer insulating layer 111b may be made of an inorganic material, but is not necessarily limited thereto.

The source electrode 112c may be electrically connected to the source area of the active layer 112a through a source contact hole provided in the interlayer insulating layer 111b overlapped with the source area of the active layer 112a.

The drain electrode 112d may be electrically connected to the drain area of the active layer 112a through a drain contact hole provided in the interlayer insulating layer 111b overlapped with the drain area of the active layer 112a.

The drain electrode 112d and the source electrode 112c may be made of the same metal material. For example, each of the drain electrode 112d and the source electrode 112c may be made of a single metal layer, a single layer of an alloy or a multi-layer of two or more layers, which is the same as or different from that of the gate electrode.

In addition, the circuit area may further include first and second switching thin film transistors disposed together with the thin film transistor 112, and a capacitor. Since each of the first and second switching thin film transistors is provided on the circuit area of the pixel P to have the same structure as that of the thin film transistor 112, its description will be omitted. The capacitor may be provided in an overlap area between the gate electrode 112b and the source electrode 112c of the thin film transistor 112, which overlap each other with the interlayer insulating layer 111b interposed therebetween.

Additionally, in order to prevent a threshold voltage of the thin film transistor provided in a pixel area from being shifted by light, the display panel or the substrate 110 may further include a light shielding layer (not shown) provided below the active layer 112a of at least one of the thin film transistor 112, the first switching thin film transistor and the second switching thin film transistor. The light shielding layer may be disposed between the substrate 110 and the active layer 112a to shield light incident on the active layer 112a through the substrate 110, thereby reducing or minimizing a change in the threshold voltage of the transistor due to external light.

The passivation layer 111c may be provided on the substrate 110 to cover the pixel area in which the pixel P is disposed. The passivation layer 111c covers the drain electrode 112d and the source electrode 112c of the thin film transistor 112 and the interlayer insulating layer 111b. The passivation layer 111c may be entirely formed in the circuit area and the light emission area.

The planarization layer 113 may be formed on the substrate 110 to cover the passivation layer 111c. The planarization layer 113 may be formed entirely in the circuit area and the light emission area.

The planarization layer 113 according to an example may be formed to be relatively thick, and thus may provide a flat surface on the display portion AA. For example, the planarization layer 113 may be made of an organic material such as photo acryl, benzocyclobutene, polyimide, and fluorine resin.

The planarization layer 113 according to one example may be formed to cover the circuit element layer 111 except the edge portion of the substrate 110. Therefore, the passivation layer 111c of the circuit element layer 111 disposed at the edge portion of the substrate 110 may be exposed without being covered by the planarization layer 113.

The light emitting element layer may be disposed on the planarization layer 113. The light emitting element layer according to one example may include a pixel electrode 114, an organic light emitting layer 116 and a common electrode 117.

The pixel electrode 114 may be expressed as an anode electrode, a reflective electrode, a lower electrode or a first electrode of the organic light emitting layer 116.

Figure 8:
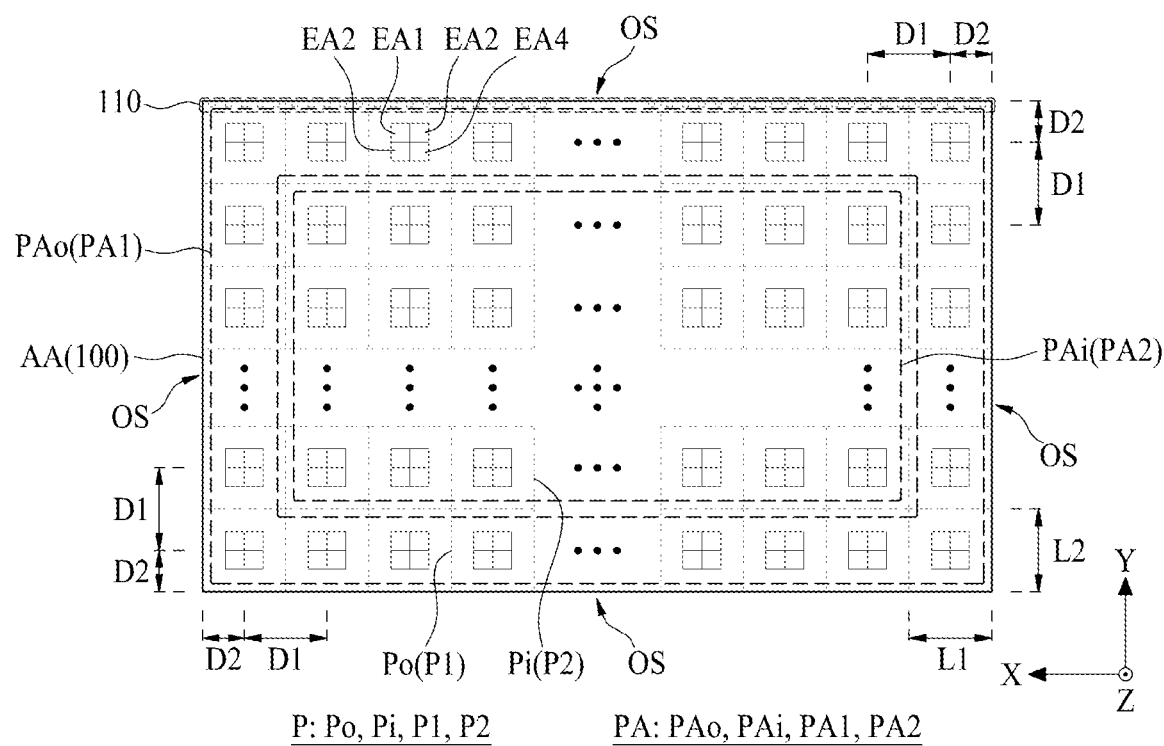
FIG. 8 is a schematic front view illustrating a display apparatus according to one embodiment of the present disclosure.

The pixel electrode 114 may be disposed on the planarization layer 113 that overlaps the light emission area EA of each pixel area PA (refer to FIG. 8). The pixel electrode 114 may be patterned in an island shape to be disposed in each pixel area PA, and may be electrically connected to source/drain electrodes 112c and 112d of a thin film transistor (or driving TFT) 112 of a corresponding pixel circuit. One side of the pixel electrode 114 may be extended onto the source/drain electrodes 112c and 112d of the thin film transistor 112, and may be electrically connected to the source/drain electrodes 112c and 112d of the thin film transistor 112 through a contact hole provided in the planarization layer 113.

The pixel electrode 114 according to one example may include a metal material having a low work function and excellent reflection efficiency.

As an example, when the display apparatus 100 is provided in a top emission mode, the pixel electrode 114 may be formed of a metal material having high reflectance and a stacked structure of a metal material having high reflectance and a transparent metal material. For example, the pixel electrode 114 may have a stacked structure of a lower electrode and an upper electrode. The lower electrode may be disposed between the planarization layer 113 and the upper electrode, and may have a greater coupling force with the planarization layer 113 than that with the upper electrode. The lower electrode according to one example may be provided in a stacked structure (ITO/MoTi/ITO) of MoTi and ITO to enhance the coupling force with the planarization layer 113. The upper electrode is disposed on an upper surface (or upper side) of the lower electrode, that is, between the lower electrode and the organic light emitting layer 116, and may be provided in a stacked structure (ITO/Ag/ITO) of Ag and ITO. The upper electrode may have higher reflectance, which reflects light emitted from the organic light emitting layer 116, than the lower electrode.

As shown in FIGS. 2 and 3, since the pixel electrode 114 is provided in the display portion AA, the planarization layer 113 may be provided below the pixel electrode 114 in the display portion AA. The planarization layer 113 is provided with a predetermined thickness so as to cover the thin film transistor 112 for allowing the organic light emitting layer 116 to emit light, and thus its upper surface may be flat. Therefore, the pixel electrode 114 provided on the planarization layer 113 may be also provided to be flat along a profile of the upper surface of the planarization layer 113.

A pixel electrode 114 may be used as a metal layer that implements a plurality of pad disposed in the pad portion PP. That is, pixel driving voltage pads, data pads, reference voltage pads, a plurality of pixel common voltage pads and gate pads, which are disposed in the pad portion PP, may be formed of the same material as that of the pixel electrode 114 together with the pixel electrode 114.

In addition, the pixel electrode 114 may be used as a metal layer that implements a dummy electrode DE disposed in the auxiliary electrode contact portion SCP. The dummy electrode DE according to one example may be used to disconnect the organic light emitting layer 116 from the auxiliary electrode contact portion SCP. For example, as shown in FIG. 5a, the dummy electrode DE may be provided to have a width PW more protruded than the passivation layer 111c, thereby disconnecting the organic light emitting layer 116 formed in a subsequent process. As the organic light emitting layer 116 is disconnected due to the dummy electrode DE protruded from the auxiliary electrode contact portion SCP, the common electrode 117 and the auxiliary electrode AE may be in contact with each other between the disconnected organic light emitting layers 116. As a result, the dummy electrode DE provided in the auxiliary electrode contact portion SCP may be formed of the same material as that of the pixel electrode 114 together with the pixel electrode 114.

Referring back to FIG. 3, a bank 115 may be disposed in a non-light emission area in which light is not emitted, and may be provided to surround each of the light emission areas (or light emission portions) of a plurality of subpixels. That is, the bank 115 may partition (or define) each of the light emission areas (or light emission portions).

The bank 115 may be formed to cover the edge of the pixel electrode 114, thereby partitioning (or defining) the light emission areas (or light emitting portions) of the plurality of subpixels.

The bank 115 may be formed to cover the edge of each of the pixel electrodes 114 of the subpixels and expose a portion of each of the pixel electrodes 114. Therefore, the bank 115 may prevent a short circuit between the pixel electrode 114 and the common electrode 117 at the edge of the pixel electrode 114. The exposed portion of the pixel electrode 114, which is not covered by the bank 115, may be a light emission area (or light emitting portion).

Meanwhile, the bank 115 may be formed in the auxiliary electrode contact portion SCP to cover the edge of the dummy electrode DE. The bank 115 disposed in the auxiliary electrode contact portion SCP may be a bank layer BK (refer to FIG. 7). Therefore, the bank layer BK of the auxiliary electrode contact portion SCP may be formed of the same material as that of the bank 115 provided in the pixel P together with the bank 115.

The bank 115 may be formed of an organic layer such as an acrylic resin, an epoxy resin, a phenolic resin, a polyamide resin and a polyimide resin, but is not limited thereto.

The organic light emitting layer 116 is formed on the pixel electrode 114, the bank 115, and the bank layer BK. When a voltage is applied to the pixel electrode 114 and the common electrode 117, holes and electrons move to the organic light emitting layer 116, respectively, and are combined with each other in the organic light emitting layer 116 to emit light.

The organic light emitting layer 116 may be formed of a common layer provided on a plurality of subpixels SP, the bank 115, and the bank layer BK. In this case, the organic light emitting layer 116 may be provided in a tandem structure in which a plurality of light emitting layers, for example, a yellow-green light emitting layer and a blue light emitting layer are stacked, and may emit white light when an electric field is formed between the pixel electrode 114 and the common electrode 117.

A color filter (not shown) corresponding to a color of a corresponding subpixel may be formed on each of a plurality of subpixels SP. For example, a red color filter may be provided in a red subpixel, a green color filter may be provided in a green subpixel, and a blue color filter may be provided in a blue subpixel. A white subpixel may not include a color filter because the organic light emitting layer 116 emits white light.

The common electrode 117 is formed on the organic light emitting layer 116. The common electrode 117 may be a second electrode or a cathode electrode. The common electrode 117 may be a common layer commonly formed in the subpixels. The common electrode 117 may be formed of a transparent metal material, a semi-transmissive metal material or a metal material having high reflectance.

When the common electrode is made of a transparent conductive material such as IZO, electron mobility is low, whereby problems occur in that power consumption is high and luminance is low.

Therefore, in the display apparatus 100 according to one embodiment of the present disclosure, the common electrode 117 may include at least one of Mg and Ag, which is a metal material. As the common electrode 117 includes a metal material such as Mg and Ag, electron mobility to the organic light emitting layer 116 may be enhanced, whereby power consumption used during light emission may be lowered, and luminance of an image may be improved.

Meanwhile, in the display apparatus 100 according to one embodiment of the present disclosure, since the common electrode 117 is provided to include at least one of Mg and Ag, which is a metal material, the common electrode 117 may be formed by the same process as a chemical vapor deposition (CVD) process of forming the organic light emitting layer 116. The transparent conductive material, such as IZO, may be formed by a sputtering process, whereas the metal material, such as Mg, Ag, may be difficult to be formed by the sputtering process. In the display apparatus 100 according to one embodiment of the present disclosure, the common electrode 117 including at least one of Mg and Ag may be electrically connected to the auxiliary electrode AE in the auxiliary electrode contact portion SCP to avoid non-uniform luminance between the edge portion and the central portion of the display portion AA. This will be described later in detail.

Referring back to FIG. 3, an encapsulation layer 118 is formed on the common electrode 117. The encapsulation layer 118 serves to prevent oxygen or moisture from being permeated into the organic light emitting layer 116 and the common electrode 117. Accordingly, in some embodiments, the encapsulation layer 118 may include at least one inorganic layer and at least one organic layer. For example, the encapsulation layer 118 may include a first inorganic layer 118a, an organic layer 118b covering the first inorganic layer 118a and a second inorganic layer 118c covering the organic layer 118b.

The display apparatus 100 according to one embodiment of the present disclosure may further include a film FF disposed on the substrate 110.

The film FF may be disposed on the encapsulation layer 118. For example, the film FF may be coupled to the encapsulation layer 118 via a transparent adhesive member.

The film FF according to one example may include an anti-reflective layer (or anti-reflective film) for preventing reflection of external light and improving outdoor visibility and a contrast ratio for an image displayed on the display apparatus. For example, the anti-reflective layer may include a circularly polarized layer (or circularly polarized film) that blocks reflective light that is reflected by a TFT and/or pixel driving lines disposed on the substrate 110 and again moves to the outside.

The film FF according to one example may further include a barrier layer (or barrier film) for primarily preventing moisture or oxygen permeation, wherein the barrier layer may be made of a material having low moisture permeability, for example, a polymer material.

The film FF according to one example may further include an optical path control layer (or optical path control film) for controlling a path of light emitted from each pixel P to the outside. The optical path control layer includes a structure in which a high refractive index layer and a low refractive index layer are alternately stacked, thereby changing a path of light incident from each pixel P to reduce or minimize a color shift phenomenon according to a viewing angle. Thus, the film FF may be a functional film having at least one of the above functions.

Hereinafter, the auxiliary electrode contact portion SCP of the display apparatus 100 according to one embodiment of the present disclosure will be described in detail with reference to FIGS. 1 to 5b.

The auxiliary electrode contact portion SCP serves to avoid non-uniform luminance due to common voltage drop of the central portion and the edge portion of the substrate 110. The auxiliary electrode contact portion SCP according to one example may be provided between the plurality of pixels P inside the display portion AA or in a boundary portion of the pixels P. The auxiliary electrode contact portion SCP is provided between the plurality of pixels P, and thus does not have to cover a light emission area of each pixel, whereby deterioration of luminance may be avoided.

The common electrode 117 and the auxiliary electrode AE may be electrically connected to each other in the auxiliary electrode contact portion SCP. The auxiliary electrode AE may be electrically connected to the auxiliary voltage line AEL extended from the edge portion of the substrate 110 to the display portion AA. The auxiliary voltage line AEL may be connected to the pad portion PP disposed at one side of the edge portion of the substrate 110 and extended to the display portion AA. Therefore, in the display apparatus 100 according to one embodiment of the present disclosure, since a common voltage may be directly applied to the central portion of the display portion AA through the auxiliary voltage line AEL and the auxiliary electrode AE without passing through the pixels P disposed at the edge portion of the display portion AA, non-uniform luminance between the edge portion and the central portion of the substrate 110 may be avoided.

The auxiliary electrode contact portion SCP may include a first auxiliary contact portion SCP1 and a second auxiliary contact portion SCP2 spaced apart from the first auxiliary contact portion SCP1 in a second direction Y based on line II-IP shown in FIG. 4. The first auxiliary contact portion SCP1 may be spaced apart from the second auxiliary contact portion SCP2 in a first direction X. The common electrode 117 may be in contact with the auxiliary electrode AE at a spaced portion DP where the first auxiliary contact portion SCP1 and the second auxiliary contact portion SCP2 are spaced apart from each other (i.e., disposed between the first auxiliary contact portion SCP1 and the second auxiliary contact portion SCP2). In more detail, the common electrode 117 may be in contact with the auxiliary electrode AE disposed in the first auxiliary contact portion SCP1 adjacent to the spaced portion DP.

The auxiliary electrode contact portion SCP according to one example may include a dummy electrode DE in the shape of a horse's hoof shape or a ' E' shape, and an auxiliary electrode AE that overlaps the dummy electrode DE in a thickness direction Z of the substrate 110. The dummy electrode DE and the auxiliary electrode AE may be provided in each of the first auxiliary contact portion SCP1, the second auxiliary contact portion SCP2 and the spaced portion DP.

The display apparatus 100 according to one embodiment of the present disclosure may include a height control layer HCL.

Referring to FIG. 5a, the height control layer HCL according to one example may be provided between the substrate 110 and the auxiliary electrode AE. In more detail, the height control layer HCL may be disposed on the buffer layer BL provided on the substrate 110. As the height control layer HCL is provided between the substrate 110 (or the buffer layer BL) and the auxiliary electrode AE, the auxiliary electrode AE may be disposed to be spaced apart from an upper surface of the substrate 110 at a predetermined distance in the thickness direction Z of the substrate 110. Therefore, as shown in FIG. 5a, a portion (or second auxiliary electrode) of the auxiliary electrode AE, which is formed to be subsequent to the height control layer HCL, may be extended to the second auxiliary contact portion SCP2 while covering the side of the height control layer HCL. Therefore, a portion (or second auxiliary electrode) of the auxiliary electrode AE may be exposed in the spaced portion DP. The height control layer HCL provided in the auxiliary electrode contact portion SCP may be formed of the same material as that of the interlayer insulating layer 111b provided in the plurality of pixels P together with the interlayer insulating layer 111b.

On the other hand, since the second auxiliary contact portion SCP2 does not include a height control layer HCL, as shown in FIG. 5a, a height H1 of the first auxiliary contact portion SCP1 may be higher than a height H2 of the second auxiliary contact portion SCP2.

Meanwhile, in the auxiliary electrode contact portion SCP, the common electrode 117 may be in contact with the auxiliary electrode AE (or second auxiliary electrode) covering the side of the height control layer HCL, so that the common voltage from the auxiliary electrode AE may be applied thereto. Therefore, in the display apparatus 100 according to one embodiment of the present disclosure, since the common voltage may be applied to the inside (or central portion) of the display portion AA through the auxiliary electrode AE, non-uniform luminance of the display portion AA may be avoided.

As described above, since the height control layer HCL is not provided in the second auxiliary contact portion SCP2, the common electrode 117 may be in contact with the auxiliary electrode AE in the first auxiliary contact portion SCP1 provided with the height control layer HCL. In more detail, an upper surface (or side) of a portion (or second auxiliary electrode) of the auxiliary electrode AE covering the side of the height control layer HCL may be exposed in the first auxiliary contact portion SCP1 (or the spaced portion DP). In other words, the auxiliary electrode AE may be exposed in the auxiliary electrode contact portion to cover the side of the height control layer HCL. The common electrode 117 formed by a subsequent process may be in contact with a portion (or second auxiliary electrode) of the auxiliary electrode AE exposed in the first auxiliary contact portion SCP1. As a result, based on FIG. 5a, the common electrode 117 may be in side contact with the side of the auxiliary electrode AE in the auxiliary electrode contact portion SCP so that the common voltage from the inside (or central portion) of the display portion AA may be additionally applied thereto. In this case, the side of the auxiliary electrode AE may mean the auxiliary electrode AE disposed in a direction that is not parallel with the upper surface of the substrate 110, for example, in the direction Z.

Referring back to FIG. 5a, the auxiliary electrode AE may include a first auxiliary electrode AE1 and a second auxiliary electrode AE2.

The first auxiliary electrode AE1 according to one example may be disposed on the upper surface of the height control layer HCL. The first auxiliary electrode AE1 may be made of a metal material such as Cu.

A portion of the second auxiliary electrode AE2 according to one example may be disposed on the upper surface of the first auxiliary electrode AE1 and cover the side of the height control layer HCL. In this case, the second auxiliary electrode AE2 may also cover a side of the first auxiliary electrode AE1 positioned between the height control layer HCL and the second auxiliary electrode AE2. The second auxiliary electrode AE2 may be made of a transparent conductive material such as ITO. The first auxiliary electrode AE1 made of Cu may be damaged by an etching material used in a patterning of the dummy electrode DE, for example, an etching material such as Ag etchant. Therefore, as shown in FIG. 5a, the side of the first auxiliary electrode AE1 may be covered by the second auxiliary electrode AE2 made of ITO so as not to be exposed in the spaced portion DP. This is because that the second auxiliary electrode AE2 made of ITO is not damaged by an etching material such as Ag etchant.

Therefore, in the display apparatus 100 according to one embodiment of the present disclosure, the second auxiliary electrode AE2 may be in contact with the common electrode 117 to apply the common voltage and protect the first auxiliary electrode AE1 from the etching material (or patterning material) of the dummy electrode DE. As a result, the second auxiliary electrode AE2 may be in contact with the common electrode 117 while covering the side of the first auxiliary electrode AE1 in the first auxiliary contact portion SCP1. As shown in FIG. 5a, an inner surface (or left side) of the second auxiliary electrode AE2 may cover the side of the first auxiliary electrode AE1, and an outer surface (or right side) of the second auxiliary electrode AE2 may be in contact with the common electrode 117. As shown in FIG. 5a, the common electrode 117 disposed in the spaced portion DP is in contact with the side of the second auxiliary electrode AE2 and thus may be expressed as a side contact.

In FIG. 5a, the common electrode 117 in the spaced portion DP is shown as being completely disconnected from the common electrode 117 provided in each of the first auxiliary contact portion SCP1 and the second auxiliary contact portion SCP2. However, this is due to the cross-sectional view taken along line II-IP shown in FIG. 4, and substantially, the common electrode 117 disposed in the spaced portion DP is electrically connected to another common electrode 117 as shown in FIG. 5b. Therefore, the end of the disconnected common electrode 117 in the spaced portion DP is in contact with the auxiliary electrode AE (or the second auxiliary electrode AE2) covering the side of the height control layer HCL, so that the common voltage may be applied to the common electrode 117 in the display portion AA through the common electrode 117 disposed in the spaced portion DP and the second auxiliary electrode AE2 disposed in the spaced portion DP.

Meanwhile, as shown in FIG. 5a, a portion of the second auxiliary electrode AE2 may be disposed in the first auxiliary contact portion SCP1, and may be extended from the first auxiliary contact portion SCP1 to the second auxiliary contact portion SCP2 through the spaced portion DP. Therefore, the second auxiliary electrode AE2 may overlap each of the first auxiliary contact portion SCP1, the spaced portion DP and the second auxiliary contact portion SCP2 in the thickness direction Z of the substrate 110.

In the display apparatus 100 according to one embodiment of the present disclosure, the organic light emitting layer 116 is formed through a front deposition process prior to the common electrode 117, and thus may be disposed below the common electrode 117. The organic light emitting layer 116 may be disconnected by the dummy electrode DE having a width PW protruded toward the spaced portion DP, that is, the dummy electrode DE more protruded toward the spaced portion DP than the passivation layer 111c disposed on the auxiliary electrode AE during front deposition. As the dummy electrode DE is more protruded than the passivation layer 111c toward the spaced portion DP, the protruded dummy electrode DE may overlap the auxiliary electrode AE (or the second auxiliary electrode AE2) covering the side of the height control layer HCL in the thickness direction Z of the substrate 110. The auxiliary electrode AE (or the second auxiliary electrode AE2) covering the side of the height control layer HCL may be expressed as the auxiliary electrode AE (or the second auxiliary electrode AE2) exposed in the spaced portion DP.

Therefore, as shown in FIG. 5a, the organic light emitting layer 116 may be disconnected in the spaced portion DP, and the second auxiliary electrode AE2 covering the side of the first auxiliary electrode AE1 and/or the side of the height control layer HCL may be exposed in the spaced portion DP due to the disconnected organic light emitting layer 116. The common electrode 117 disposed on the disconnected organic light emitting layer 116 in the spaced portion DP may be in side contact with the second auxiliary electrode AE2 exposed in the spaced portion DP.

The organic light emitting layer 116 is formed later than the dummy electrode DE, and thus may be disposed on the dummy electrode DE. As described above, since the organic light emitting layer 116 is disconnected by the dummy electrode DE protruded toward the spaced portion DP, the organic light emitting layer 116 may be disposed only on the upper surface of the dummy electrode DE disposed in the first auxiliary contact portion SCP1, and may not be in contact with the side of the passivation layer 111c disposed on the lower surface of the dummy electrode DE. Therefore, the common electrode 117, which is formed by a chemical vapor deposition (CVD) process in a subsequent process, may be thinner toward the end of the protruded dummy electrode DE like the organic light emitting layer 116 and thus may not be in contact with the side of the passivation layer 111c. The common electrode 117, which is formed by a chemical vapor deposition (CVD) process, may be disconnected in the spaced portion DP provided in the form of a groove or trench like the organic light emitting layer 116.

In the display apparatus 100 according to one embodiment of the present disclosure, since the common electrode 117 includes at least one of Mg and Ag, the common electrode 117 may be formed by a chemical vapor deposition (CVD) process. Therefore, the common electrode 117 may have the same or similar profile as or to that of the organic light emitting layer 116 formed by the chemical vapor deposition (CVD) process as shown in FIGS. 5a and 5b. If the common electrode is formed by a sputtering process not the CVD process, such a common electrode may be in contact with the side of the passivation layer, and may have a shape connected in one body even in the spaced portion without being disconnected. This is because that the sputtering process has step coverage higher than that of the CVD process. As described above, since the common electrode formed by the sputtering process is made of a transparent conductive material such as IZO, electron mobility is low, whereby problems occur in that power consumption is high and luminance is low. However, in the display apparatus 100 according to one embodiment of the present disclosure, since the common electrode 117 includes at least one of Mg and Ag, electron mobility to the organic light emitting layer 116 may be enhanced, whereby power consumption may be reduced, and luminance of an image may be enhanced.

Referring back to FIG. 5a, the display apparatus 100 according to one embodiment of the present disclosure may further include an auxiliary layer SL.

The auxiliary layer SL is to increase a height (or length or area) of the second auxiliary electrode AE2 exposed to the spaced portion DP. The auxiliary layer SL according to one example may be disposed between the buffer layer BL and the height control layer HCL. Therefore, the height (or length or area) of the second auxiliary electrode AE2 exposed in the spaced portion DP may be more increased than the case that there is no auxiliary layer SL, whereby a contact area CH where the common electrode 117 may be in contact with the exposed auxiliary electrode AE2 may be increased. Therefore, in the display apparatus 100 according to one embodiment of the present disclosure, a contact defect in which the common electrode and the auxiliary electrode are not in contact with each other may be avoided. If the common electrode 117 and the auxiliary electrode AE may be in contact with each other by only the height control layer HCL, the auxiliary layer SL may be omitted to reduce the manufacturing cost.

The auxiliary layer SL may be provided as at least one layer. For example, the auxiliary layer SL may include a first auxiliary layer SL1 disposed on the upper surface of the buffer layer BL and a second auxiliary layer SL2 disposed on an upper surface of the first auxiliary layer SL1. The first auxiliary layer SL1 and the second auxiliary layer SL2 may be provided between the buffer layer BL and the height control layer HCL through a separate process, but are not limited thereto. In order to simplify the manufacturing process, the first auxiliary layer SL1 may be formed of the same material as that of the gate insulating layer 111a provided in the plurality of pixels P through the same process as that of the gate insulating layer 111a. In order to simplify the manufacturing process, the second auxiliary layer SL2 may be formed of the same material as that of the gate electrode 112b provided in the plurality of pixels P through the same process as that of the gate electrode 112b.

The auxiliary layer SL according to one example may be provided only in a portion of the first auxiliary contact portion SCP1 because it has only to increase the contact area CH of the second auxiliary electrode AE2. Therefore, as shown in FIG. 5a, the auxiliary layer SL may not overlap the first auxiliary electrode AE1 that is not overlapped with the second auxiliary electrode AE2.

Referring back to FIG. 5a, as the auxiliary layer SL is disposed between the buffer layer BL and the height control layer HCL, the second auxiliary electrode AE2 may cover the side of the first auxiliary electrode AE1, the side of the height control layer HCL and the side of the auxiliary layer SL. The common electrode 117 disposed in the spaced portion DP may be in side contact with the second auxiliary electrode AE2 covering the side of the first auxiliary electrode AE1, the side of the height control layer HCL and the side of the auxiliary layer SL.

Figure 6:
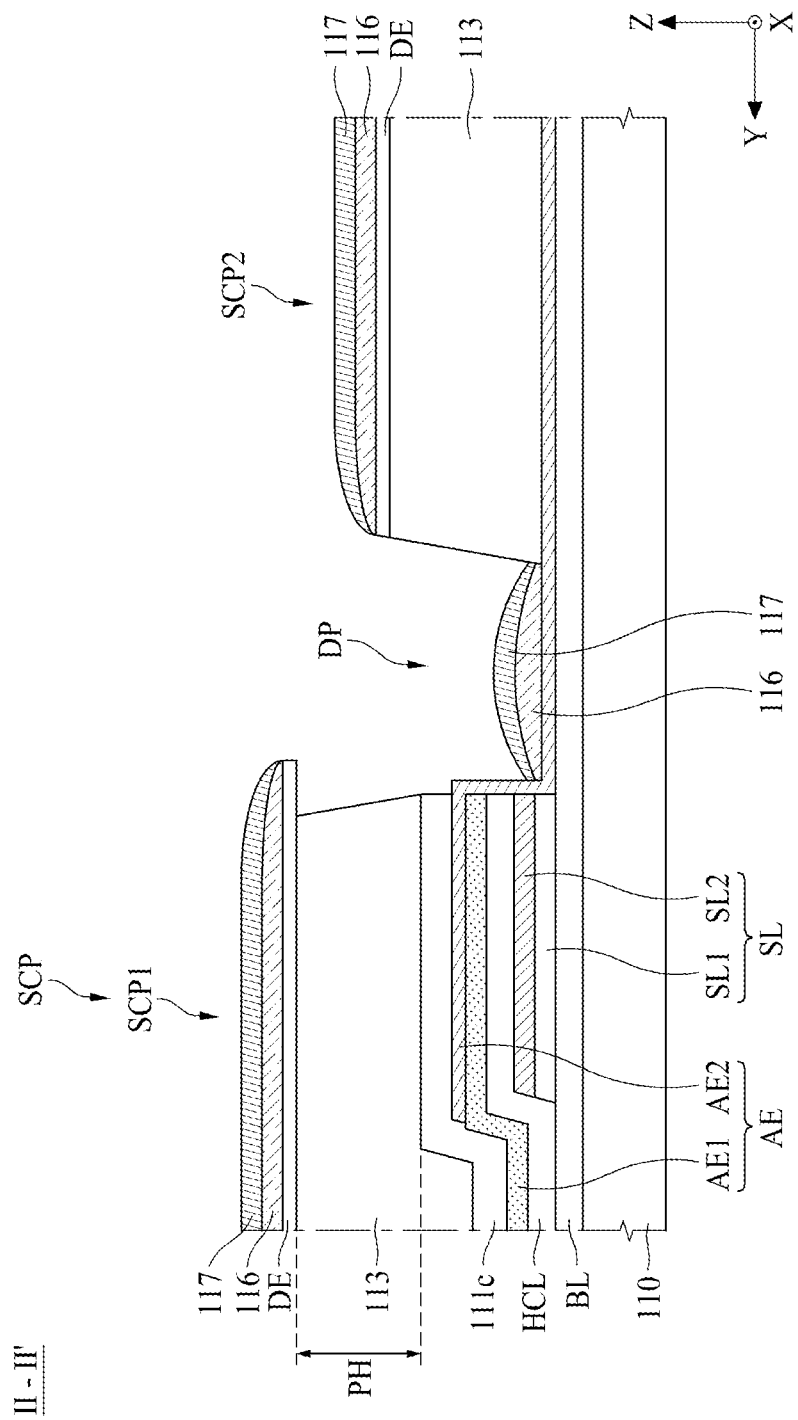
FIG. 6 is another cross-sectional view taken along line II-II' shown in FIG. 4.

FIG. 6 is another cross-sectional view taken along line II-IP shown in FIG. 4.

Referring to FIG. 6, in the display apparatus 100 according to one embodiment of the present disclosure, the auxiliary electrode contact portion SCP according to another example may further include a planarization layer 113. The display apparatus 100 according to FIG. 6 is the same as the display apparatus of FIG. 5a except that the auxiliary electrode contact portion SCP further includes a planarization layer 113. Therefore, the same reference numerals are given to the same elements, and the following description will be based on differences from FIG. 5a.

In case of the display apparatus 100 shown in FIG. 5a, the dummy electrode DE disposed on the passivation layer 111c is formed to be protruded toward the spaced portion DP, whereby the protruded dummy electrode DE serves as eaves (or mask) to disconnect the organic light emitting layer 116 formed in a subsequent process.

In contrast, the display apparatus 100 according to FIG. 6 includes a planarization layer 113 so that the protruded dummy electrode DE is further spaced apart from the second auxiliary electrode AE2 in an upward direction, whereby the organic light emitting layer 116 may be more definitely disconnected in the spaced portion DP (or the first auxiliary contact portion SCP1).

The planarization layer 113 according to one example may be disposed between the passivation layer 111c and the dummy electrode DE. Therefore, a height of the first auxiliary contact portion SCP1 may become high as much as a height PH of the planarization layer 113. As the height of the first auxiliary contact portion SCP1 becomes higher than a height H1 of the first auxiliary contact portion SCP1 of FIG. 5a, the organic light emitting layer 116 entirely deposited by the CVD process may be more definitely disconnected in the first auxiliary contact portion SCP1. This is because that the common electrode 117 formed by the CVD process in a subsequent process may not be in contact with the second auxiliary electrode AE2 if the organic light emitting layer 116 covers the second auxiliary electrode AE2 exposed in the first auxiliary contact portion SCP1 (or the spaced portion DP).

Therefore, in the display apparatus according to FIG. 6, the dummy electrode DE (or the organic light emitting layer 116 on the dummy electrode DE) may be provided to be more spaced apart from the upper surface of the second auxiliary electrode AE2 disposed in the spaced portion DP as much as the height PH of the planarization layer 113 than the display apparatus according to FIG. 5a. Therefore, in the display apparatus of the present disclosure according to FIG. 6, since the organic light emitting layer 116 may be definitely disconnected so as not to cover the entire second auxiliary electrode AE2 exposed in the spaced portion DP, a contact defect between the second auxiliary electrode AE2 and the common electrode 117 may be more effectively avoided. The height PH of the planarization layer 113 may be expressed as any one of a length, a thickness and an area of the planarization layer 113.

Figure 7:
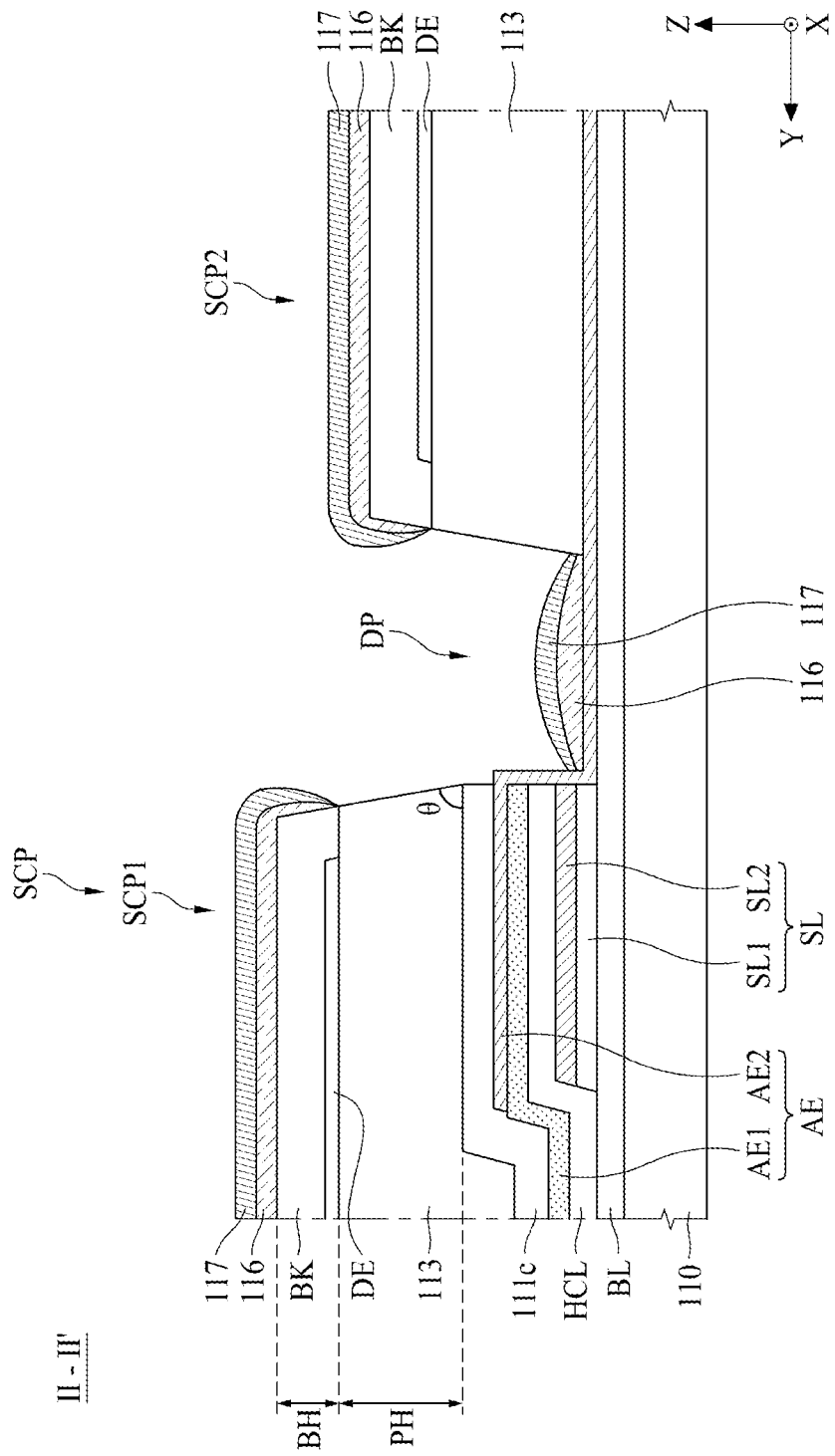
FIG. 7 is other cross-sectional view taken along line II-II' shown in FIG. 4.

FIG. 7 is other cross-sectional view taken along line II-II' shown in FIG. 4.

Referring to FIG. 7, the display apparatus 100 according to another embodiment of the present disclosure is the same as the display apparatus according to FIG. 6 except that the auxiliary electrode contact portion SCP further includes a bank layer BK and a structure of the dummy electrode DE is modified. Therefore, the same reference numerals are given to the same elements, and the following description will be based on differences from FIG. 6.

In case of the display apparatus 100 according to FIG. 6, the dummy electrode DE disposed on the passivation layer 111c is formed to be protruded toward the spaced portion DP, and a spaced distance between the dummy electrode DE (or the organic light emitting layer 116 on the dummy electrode DE) and the second auxiliary electrode AE2 may be increased using the planarization layer 113 disposed between the dummy electrode DE and the passivation layer 111c, whereby the organic light emitting layer 116 is disconnected in the spaced portion DP (or the first auxiliary contact portion SCP1).

In contrast, the display apparatus 100 according to FIG. 7 may further include a bank layer BK covering the dummy electrode DE disposed on the planarization layer 113, so that the organic light emitting layer 116 may be formed on the bank layer BK not the upper surface of the dummy electrode DE. Therefore, in the display apparatus 100 according to FIG. 7, the organic light emitting layer 116 may be positioned to be higher than the organic light emitting layer 116 disposed in the first auxiliary contact portion SCP1 of FIG. 6 as much as a height BH of the bank layer BK. Therefore, the organic light emitting layer 116 may be disconnected in the spaced portion DP (or the first auxiliary contact portion SCP1) even though the dummy electrode DE is not protruded toward the spaced portion DP as shown in FIG. 7. Since the dummy electrode DE of the first auxiliary contact portion SCP1 is not protruded toward the spaced portion DP, a process for protruding the dummy electrode DE toward the spaced portion DP may be omitted, whereby the manufacturing cost and tact time may be reduced.

However, without limitation to the above example, the dummy electrode DE may be provided to be protruded toward the spaced portion DP between the planarization layer 113 and the bank layer BK to increase a disconnection effect of the organic light emitting layer 116. As shown in FIG. 4, since the dummy electrode DE is provided in the form of an island or a floating type and a voltage is not applied thereto, a short between the dummy electrode DE and the common electrode 117 may not occur even though the dummy electrode DE is protruded toward the spaced portion DP. The bank layer BK of the auxiliary electrode contact portion SCP may be formed of the same material as that of the bank 115 disposed in the pixel P together with the bank 115.

Meanwhile, in the display apparatus 100 according to FIG. 7, since the organic light emitting layer 116 is disposed on the bank layer BK in the auxiliary electrode contact portion SCP (or the first auxiliary contact portion SCP1), the organic light emitting layer 116 may cover the upper surface and the side of the bank layer BK, and the common electrode 117 formed in a subsequent process may cover the upper surface (or the upper surface and the side) of the organic light emitting layer 116 covering the upper surface and the side of the bank layer BK. Since the common electrode 117 is formed by the CVD process, which has step coverage lower than that of the sputtering process, the common electrode 117 may be disconnected in the spaced portion DP provided in the form of a groove or trench between the first auxiliary contact portion SCP1 and the second auxiliary contact portion SCP2. Therefore, the common electrode 117 disposed in the first auxiliary contact portion SCP1 may be disconnected at the side of the bank layer BK or the side of the planarization layer 113.

In the display apparatus 100 according to FIG. 7, the side of the planarization layer 113 is provided at an angle θ of 70° or more with respect to the upper surface of the passivation layer 111c disposed on the lower surface of the planarization layer 113. As described above, since the organic light emitting layer 116 and the common electrode 117 are formed by the CVD process having low step coverage, if a side angle θ of the planarization layer 113, that is, a taper angle is provided at 70° or more, a material constituting the organic light emitting layer 116 and a material constituting the common electrode 117 cannot be deposited on the side of the planarization layer 113. Therefore, at least a portion of the side of the planarization layer 113 may be exposed in the auxiliary electrode contact portion SCP without being covered by the organic light emitting layer 116 and the common electrode 117.

If the side angle of the planarization layer 113 is less than 70°, the organic light emitting layer and/or the common electrode may be deposited on the side of the planarization layer 113, so that the second auxiliary electrode AE2 may not be exposed in the spaced portion DP and thus may not be in contact with the common electrode 117. Therefore, in the display apparatus 100 according to one embodiment of the present disclosure, as shown in FIG. 7, the side angle θ of the planarization layer 113 with respect to the upper surface of the passivation layer 111c is provided at 70° or more, so that the organic light emitting layer 116 and the common electrode 117 may be disconnected at the side of the planarization layer 113 even without protrusion of the dummy electrode DE with respect to the spaced portion DP. Therefore, the second auxiliary electrode AE2 may be exposed without being covered by the organic light emitting layer 116 and the common electrode 117, and the exposed second auxiliary electrode AE2 may be in side contact with the common electrode 117 formed in the spaced portion DP.

Meanwhile, if the side angle of the planarization layer 113 is provided to exceed 90°, a portion of the planarization layer 113 covers the spaced portion DP (or overlaps the spaced portion DP), so that the common electrode 117 formed in a subsequent process may not be in contact with the side of the second auxiliary electrode AE2. Therefore, the side angle of the planarization layer 113 may be 70° to 90°. That is, the planarization layer 113 may be provided to have a side angle of 70° to 90° by an exposure process using a photoresist and a mask and a patterning process using an etching material. In more detail, the time that the planarization layer 113 is exposed to the etching material may be adjusted, so that the side angle of the planarization layer 113 with respect to the upper surface of the passivation layer 111c may be 70° to 90°.

As a result, the display apparatus 100 according to one embodiment of the present disclosure may obtain the following effects.

First, in the display apparatus 100 according to one embodiment of the present disclosure, the common electrode 117 formed by the CVD process may be provided to be in side contact with the auxiliary electrode AE by using the height control layer HCL provided in the auxiliary electrode contact portion SCP, and the auxiliary electrode AE covering the side of the height control layer HCL. Therefore, in the display apparatus 100 according to one embodiment of the present disclosure, since the common voltage may be applied to the pixel P positioned inside (or in the central portion) of the display portion AA without voltage drop, non-uniform luminance with the pixel P disposed at the edge portion of the display portion AA may be avoided.

Second, in the display apparatus 100 according to one embodiment of the present disclosure, the dummy electrode DE provided in the auxiliary electrode contact portion SCP is more protruded toward the spaced portion DP, so that the second auxiliary electrode AE2 exposed in the spaced portion DP may be provided so as not to be completely covered by the organic light emitting layer 116. Therefore, in the display apparatus 100 according to one embodiment of the present disclosure, a contact defect in which the common electrode 117 and the second auxiliary electrode AE2 are not in contact with each other may be avoided.

Third, in the display apparatus 100 according to one embodiment of the present disclosure, the planarization layer 113 is further provided between the passivation layer 111c provided in the auxiliary electrode contact portion SCP and the dummy electrode DE provided in the auxiliary electrode contact portion SCP so that the organic light emitting layer 116 may be provided to be further spaced apart from the upper surface of the second auxiliary electrode AE2 disposed in the spaced portion DP as much as the height PH of the planarization layer 113. Therefore, in the display apparatus according to one embodiment of the present disclosure, since the organic light emitting layer 116 may be definitely disconnected so as not to cover the entire second auxiliary electrode AE2 in the spaced portion DP, a contact defect between the second auxiliary electrode AE2 and the common electrode 117 may be more effectively avoided.

Fourth, in the display apparatus 100 according to one embodiment of the present disclosure, the bank layer BK is further provided on the planarization layer 113 provided in the auxiliary electrode contact portion SCP and the side angle θ of the planarization layer 113 is 70° or more, so that the organic light emitting layer 116 may be disconnected at the side of the planarization layer 113 even without protrusion of the dummy electrode DE with respect to the spaced portion DP. Therefore, in the display apparatus 100 according to one embodiment of the present disclosure, the process for protruding the dummy electrode DE toward the spaced portion DP may be omitted, whereby the manufacturing process may be simplified, and the second auxiliary electrode AE2 and the common electrode 117 may be in side contact with each other.

Figure 9A:
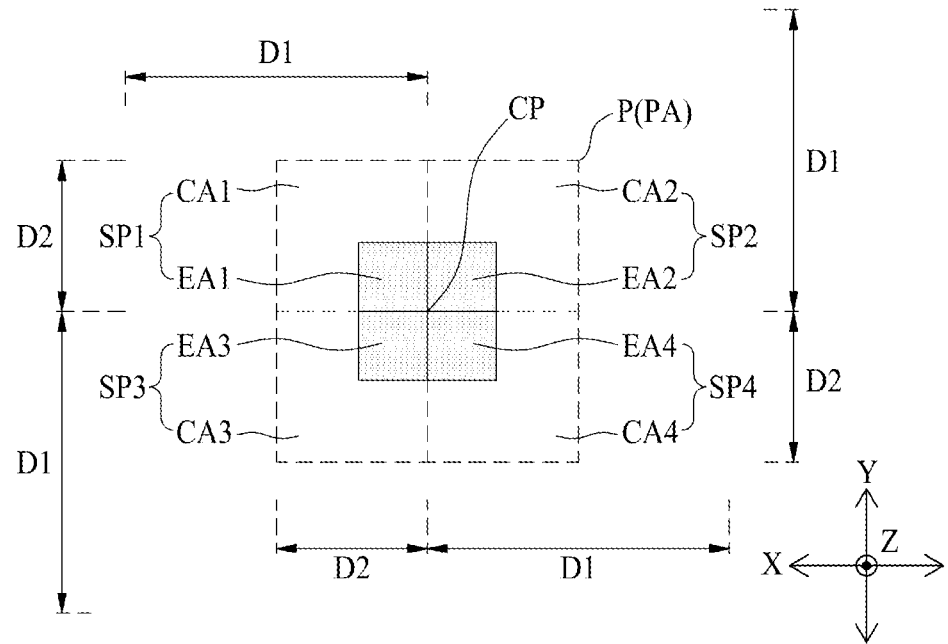
FIG. 9a is a view illustrating one subpixel according to one example shown in FIG. 8.
Figure 9B:
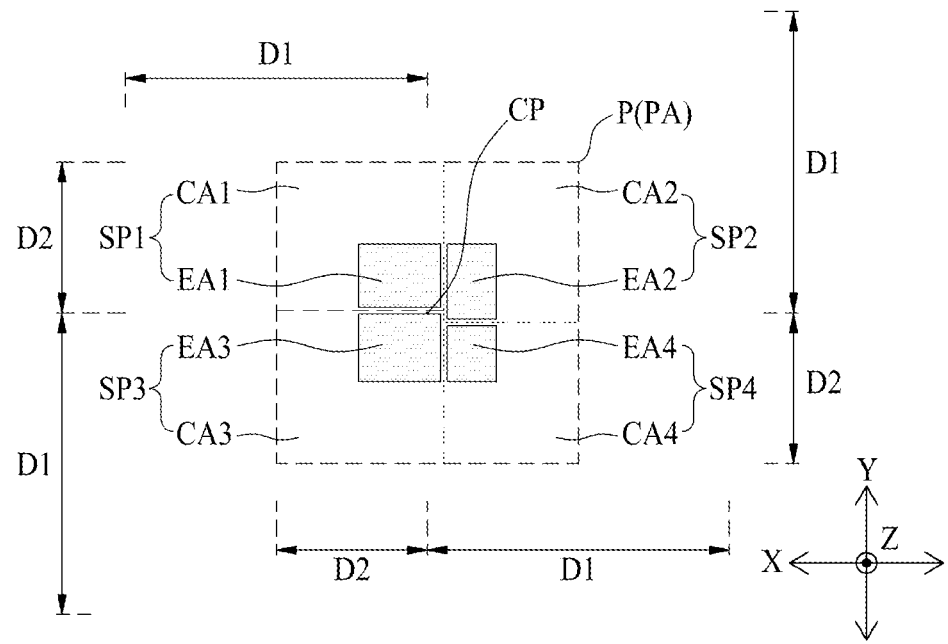
FIG. 9b is a view illustrating one subpixel according to another example shown in FIG. 8.

FIG. 8 is a schematic front view illustrating a display apparatus according to one embodiment of the present disclosure, FIG. 9a is a view illustrating one subpixel according to one example shown in FIG. 8, and FIG. 9b is a view illustrating one subpixel according to another example shown in FIG. 8.

Referring to FIG. 8, in the display apparatus 100 according to one embodiment of the present disclosure, the display panel may include a substrate 110 having a display portion AA, and a plurality of pixels P formed on the display portion AA of the substrate 110.

The display portion AA may be expressed an area where an image is displayed and may be expressed as an active portion, an active region, or a display region. A size of the display portion AA may be the same as the size of the substrate 110 (or display apparatus). Accordingly, the display portion AA is implemented (or disposed) on the entire front surface of the substrate 110 so that the substrate 110 does not include a non-display region which is provided along the edge of the substrate 110 to surround the entire display portion AA. Accordingly, the entire front surface of the display apparatus may implement the display portion AA.

The end (or outermost) of the display portion AA may be aligned with the outer surface OS of the substrate 110. For example, based on the thickness direction (Z or third direction) of the display apparatus, the lateral surface of the display portion AA may be aligned with an extended vertical extension line perpendicular to the outer surface of the substrate 110. The lateral surface of the display portion AA may be surrounded only by air without being surrounded by a separate mechanism. That is, all of the lateral surfaces of the display portion AA may have a structure in direct contact with air without being surrounded by a separate mechanism. Accordingly, since the outer surface of the substrate 110 corresponding to the end of the display portion AA is surrounded only by air, the display apparatus 100 according to the embodiment of the present disclosure may have an air-bezel structure in which the end (or the lateral surface) of the display portion AA is surrounded by air instead of an opaque non-display region or a structure without a bezel.

The plurality of pixels P may be arranged (or disposed) to have a first interval D1 on the display portion AA of the substrate 110 in each of the first direction (X) and the second direction (Y). The first direction (X) may be a horizontal direction, or a first longitudinal direction (e.g., a horizontal longitudinal direction) of the substrate 110 or the display apparatus. The second direction (Y) may be a vertical direction or may be a second longitudinal direction (e.g., a vertical longitudinal direction) of the substrate 110 or the display apparatus.

Since the plurality of pixels P may be arranged to have the first interval D1, the dummy portion DP, the pad portion PP, the connection portion and the dam may be disposed at a position included in the first interval D1 without being overlapped with the subpixels SP1, SP2, SP3 and SP4. For example, based on FIG. 9a, the dummy portion DP, the pad portion PP, the connection portion and the dam may be spaced apart from one another at a predetermined distance at a left side of the first subpixel SP1 within the range of half of the first interval D1. The pad portion PP according to another example may be provided to be disposed on a rear surface (or back surface) of the substrate 110, and when the gate driver GD is provided, the gate driver GD may be implemented (or embedded) in an entire surface (or upper surface) of the substrate 110.

Each of the plurality of pixels P may be implemented on each of a plurality of pixel regions PA defined on the display portion AA of the substrate 110. Each of the plurality of pixel regions may have a first length L1 parallel to the first direction (X) and a second length L2 parallel to the second direction (Y). The first length L1 may be equal to the second length L2 or may be equal to the first interval D1. Each of the first length L1 and the second length L2 may be equal to the first interval D1. Accordingly, the plurality of pixels P may all have the same size. For example, the first length L1 may be expressed as a first width, a horizontal length, or a horizontal width. The second length L2 may be expressed as a second width, a vertical length, or a vertical width.

Two pixels P adjacent in each of the first direction (X) and the second direction (Y) may have the same first interval D1 within an error range in the manufacturing process. The first interval D1 may be a pitch (or pixel pitch) between two adjacent pixels P. For example, the first interval D1 may be the shortest distance (or the shortest length) between the centers of each of the two adjacent pixels P. Optionally, the pixel pitch may be a size between one end and the other end of the pixel P parallel to the first direction (X). Also, in another example, the pixel pitch may be expressed as a size between one end and the other end of the pixel P parallel to the second direction (Y).

Each of the plurality of pixels P may include a circuit layer including a pixel circuit implemented in a pixel region on the substrate 110 and a light emitting device layer disposed on the circuit layer and connected to the pixel circuit. The pixel circuit outputs a data current corresponding to a data signal in response to the data signal and a scan signal supplied from pixel driving lines disposed in the pixel region. The light emitting device layer may include a light emitting layer that emits light by the data current supplied from the pixel circuit.

The plurality of pixels P may be divided into outermost pixels Po and internal pixels Pi.

The outermost pixels Po (or the first pixels) may be pixels disposed closest to the dam or the outer surface of the substrate 110 among the plurality of pixels P, and may be pixels disposed in the outermost pixel regions PAo (or the second pixel regions PA2). For example, the outermost pixels Po may be expressed as first pixels P1. The internal pixels Pi may be pixels disposed in the internal pixel regions PAi (or the first pixel regions PA1), and may be expressed as second pixels P2. The outermost pixels Po may include a pad portion PP connected to at least one auxiliary voltage line.

The second interval D2 between the central portion of the outermost pixels Po and the outer surface or outer side of the substrate 110 may be half or less than half the first interval D1. For example, the second interval D2 may be the shortest distance (or the shortest length) between the center of the outermost pixels Po and the outer surface of the substrate 110.

When the second interval D2 exceeds half of the first interval D1, the substrate 110 has a larger size than the display portion AA by a difference between the half of the first interval D1 and the second interval D2, and therefore, the region between the end of the outermost pixel Po and the outer surface of the substrate 110 may be configured as a non-display region surrounding the entire display portion AA. For example, when the second interval D2 exceeds half of the first interval D1, the substrate 110 inevitably includes a bezel region according to the non-display region surrounding the entire display portion AA. Therefore, when the plurality of display apparatuses 100 are disposed adjacent to each other, the sum of the second intervals D2 of each of two the substrates 110 is greater than the first interval D1, so that the sum (or seam) of the bezel region of each the substrate 110 may be recognized by the user.

Meanwhile, when the second interval D2 is half or less than half the first interval D1, the end of the outermost pixel Po may be aligned with the outer surface of the substrate 110 or the end of the display portion AA may be aligned with the outer surface or outer side of the substrate 110, and thus the display portion AA may be implemented (or disposed) on the entire surface of the substrate 110. Accordingly, even if a plurality of display apparatuses 100 according to an embodiment of the present disclosure are disposed adjacently, a seam may not be recognized by a user.

The internal pixels Pi may be pixels other than the outermost pixels Po among the plurality of pixels P or pixels surrounded by the outermost pixels Po among the plurality of pixels P. The internal pixels Pi may be represented by second pixels. These internal pixels Pi may be implemented in a configuration or structure different from that of the outermost pixel Po.

Referring to FIGS. 8 and 9A, one pixel P according to an embodiment of the present disclosure may include first to fourth sub-pixels SP1, SP2, SP3, and SP4 disposed in the pixel region PA.

The first sub-pixel SP1 may be disposed in a first sub-pixel region of the pixel region PA, the second sub-pixel SP2 may be disposed in a second sub-pixel region of the pixel region PA, the third subpixel SP3 may be disposed in a third subpixel region of the pixel region PA, and the fourth subpixel SP4 may be disposed in a fourth subpixel region of the pixel region PA.

As an example, the first subpixel SP1 may be implemented to emit light of a first color, the second subpixel SP2 may be implemented to emit light of a second color, the third subpixel SP3 may be implemented to emit light of a third color, and the fourth sub-pixel SP4 may be implemented to emit light of the fourth color. Each of the first to fourth colors may be different. For example, the first color may be red, the second color may be blue, the third color may be white, and the fourth color may be green.

As another example, some of the first to fourth colors may be the same. For example, the first color may be red, the second color may be first green, the third color may be second green, and the fourth color may be blue.

Each of the first to fourth sub-pixels SP1, SP2, SP3, and SP4 may include light emitting region EA1, EA2, EA3, and EA4 and circuit regions CA1, CA2, CA3, and CA4.

The light emitting regions EA1, EA2, EA3, and EA4 may be disposed to be shifted toward the center portion CP of the pixel P in the sub-pixel region. For example, the light emitting regions EA1, EA2, EA3, and EA4 may be expressed as an opening region, an opening, or a light emitting portion.

According to an example, the respective light emitting regions EA1, EA2, EA3, and EA4 of each of the first to fourth sub-pixels SP1, SP2, SP3, and SP4 may have the same size. For example, each of the light emitting regions EA1, EA2, EA3, and EA4 of the first to fourth subpixels SP1, SP2, SP3, and SP4 may have a uniform quad structure or a uniform stripe structure. For example, the light emitting regions EA1, EA2, EA3, and EA4 having a uniform quad structure or a uniform stripe structure may have a size smaller than a quadrant size of the pixel P and may be disposed to be shifted toward the central portion CP in the sub-pixel region or may be disposed to be concentrated in the central portion CP of the pixel P.

Referring to FIGS. 8 and 9B, the respective light emitting regions EA1, EA2, EA3, and EA4 of each of the first to fourth subpixels SP1, SP2, SP3, and SP4 according to another example may have different sizes. For example, each of the light emitting regions EA1, EA2, EA3, and EA4 of the first to fourth subpixels SP1, SP2, SP3, and SP4 may have a non-uniform quad structure or a non-uniform stripe structure.

The size of each of the first to fourth sub-pixels SP1, SP2, SP3, and SP4 having a non-uniform quad structure (or a non-uniform stripe structure) may be set according to resolution, luminous efficiency, or image quality. As an example, when the light emitting regions EA1, EA2, EA3, and EA4 have an unequal quad structure (or unequal stripe structure), the light emitting region EA4 of the fourth subpixel SP4, among the respective light emitting regions EA1, EA2, EA3, and EA4 of each of the first to fourth subpixels SP1, SP2, SP3, and SP4 may have the smallest size, and the light emitting region EA3 of the third subpixel SP3 may have the largest size. For example, the light emitting regions EA1, EA2, EA3, and EA4 having a non-uniform quad structure (or a non-uniform stripe structure) may be concentrated around the central portion CP of one pixel P. In one pixel P (or pixel region PA), the central portions of the light emitting regions EA1, EA2, EA3, and EA4 are aligned with the central portion CP of the pixel P or spaced apart from the central portion CP of the pixel P.

The respective circuit regions CA1, CA2, CA3, and CA4 of each of the first to fourth sub-pixels SP1, SP2, SP3, and SP4 may be disposed around the corresponding light emitting regions EA1, EA2, EA3, and EA4. The circuit regions CA1, CA2, CA3, and CA4 may include a circuit for emitting a corresponding sub-pixel and pixel driving lines. For example, the circuit regions CA1, CA2, CA3, and CA4 may be expressed as a non-light-emitting region, a non-opening region, a non-light-emitting portion, a non-opening portion, or a peripheral portion.

Alternatively, in order to increase an aperture ratio of the sub-pixels SP1, SP2, SP3, and SP4 corresponding to the size of the light emitting regions EA1, EA2, EA3, and EA4 or to reduce a pixel pitch D1 according to high resolution of the pixel P, the respective light emitting regions EA1, EA2, EA3, and EA4 of each of the first to fourth sub-pixels SP1, SP2, SP3, and SP4 may be extended onto the circuit regions CA1, CA2, CA3, and CA4 so as to overlap some or all of the circuit regions CA1, CA2, CA3, and CA4. For example, the respective light emitting regions EA1, EA2, EA3, and EA4 of each of the first to fourth subpixels SP1, SP2, SP3 and SP4 may be implemented on the substrate 110 to overlap the corresponding circuit regions CA1, CA2, CA3, and CA4. In this case, the light emitting regions EA1, EA2, EA3, and EA4 may have a size which is the same as or larger than the circuit regions CA1, CA2, CA3, and CA4.

Alternatively, each of the plurality of pixels P according to another example may include first to third sub-pixels SP1, SP2, and SP3.

The respective light emitting regions EA1, EA2, and EA3 of each of the first to third sub-pixels SP1, SP2, and SP3 may have a rectangular shape having a shorter side parallel to the first direction (X) and a longer side parallel to the second direction (Y) and may be arranged, for example, in a 1□3 shape or a 1□3 stripe shape. For example, the first subpixel SP1 may be a red subpixel, the second subpixel SP2 may be a blue subpixel, and the third subpixel SP3 may be a green subpixel.

Figure 10:
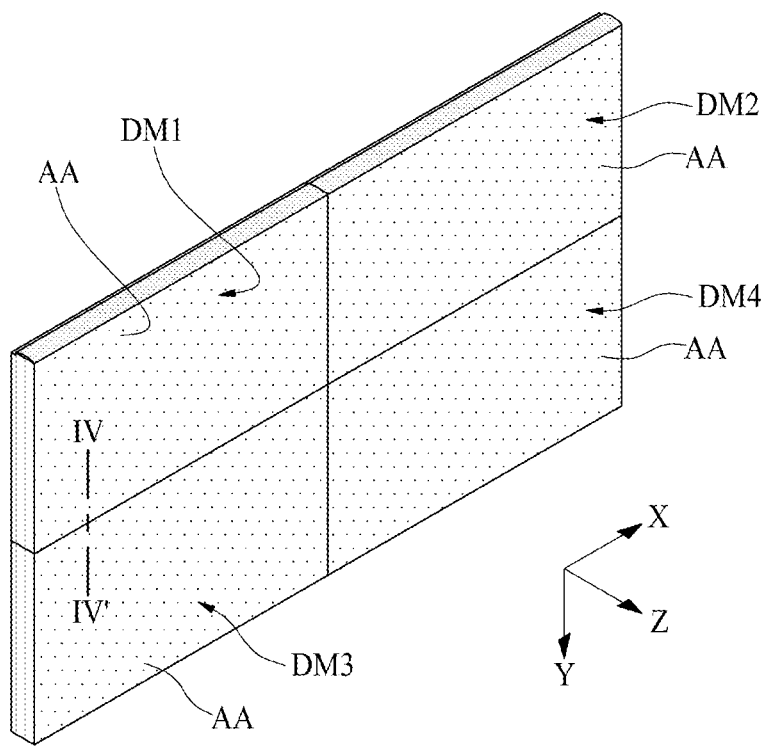
FIG. 10 is a view illustrating a multi-screen display apparatus according to one embodiment of the present disclosure.
Figure 11:
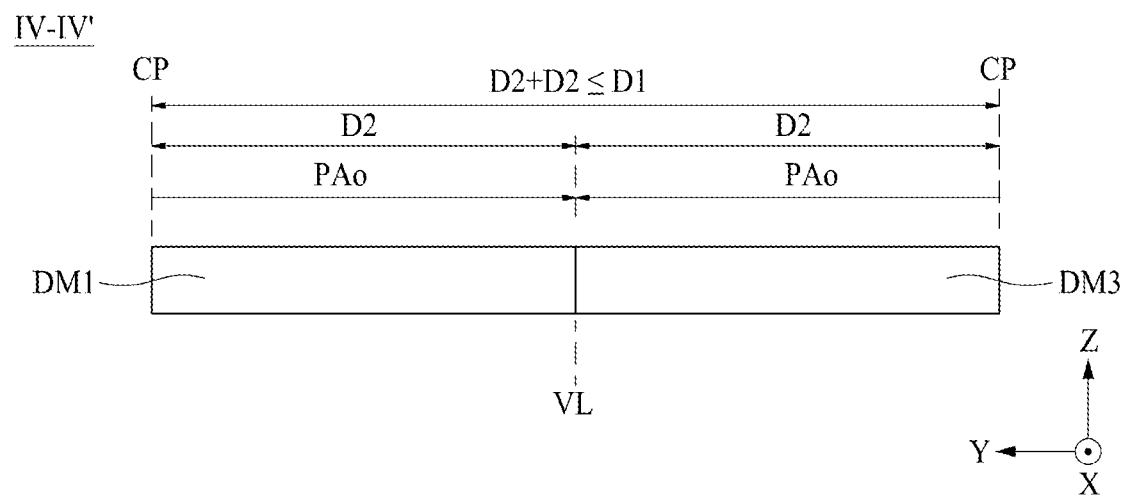
FIG. 11 is a cross-sectional view taken along line IV-IV' shown in FIG. 10.

FIG. 10 is a view illustrating a multi-screen display apparatus according to one embodiment of the present disclosure, and FIG. 11 is a cross-sectional view taken along line IV-IV' shown in FIG. 10, illustrating a multi-screen display apparatus implemented by tiling the display apparatus according to another embodiment of the present disclosure shown in FIGS. 8 to 9b.

Referring to FIGS. 10 and 11, the multi-screen display apparatus according to one embodiment of the present disclosure may include a plurality of display modules DM1, DM2, DM3 and DM4.

Each of the plurality of display modules DM1, DM2, DM3 and DM4 may display an individual image or divisionally display one image. Each of the plurality of display modules DM1, DM2, DM3 and DM4 includes the display apparatus according to another embodiment of the present disclosure shown in FIGS. 8 to 9b, and a repeated description thereof will be omitted.

Each of the plurality of display modules DM1, DM2, DM3 and DM4 may be tiled in a separate tiling frame such that their sides are in contact with each other. For example, each of the plurality of display modules DM1, DM2, DM3 and DM4 may be tiled to have a shape of N×M (N is a positive integer of 2 or more and M is a positive integer of 2 or more), whereby a multi-screen display apparatus of a large screen may be implemented.

Each of the plurality of display modules DM1, DM2, DM3 and DM4 does not include a bezel area (or non-display area) surrounding the entire display portion AA in which an image is displayed, and has an air-bezel structure in which the display portion AA is surrounded by the air. That is, in each of the plurality of display modules DM1, DM2, DM3 and DM4, the entire front surface (or upper surface) of the substrate 110 is implemented as the display portion AA.

According to the present embodiment, in each of the plurality of display modules DM1, DM2, DM3 and DM4, a second interval D2 between a central portion CP of an outermost pixel Po (or outermost pixel region PAo) and an outermost outer side of the substrate 110 is implemented as a half or less of the first interval D1 between adjacent pixels. Therefore, in two adjacent display modules DM1, DM2, DM3 and DM4, in which sides are connected with (or in contact with) each other along the first direction X and the second direction Y in accordance with a side coupling method, an interval D2+D2 between adjacent outermost pixels Po (or outermost pixel region PAo) is the same as or smaller than the first interval D1 between two adjacent pixels.

In the example of FIG. 11, in the first display module DM1 and the third display module DM3, in which sides are connected with (or in contact with) each other along the second direction Y, the interval D2+D2 between the central portion CP of the outermost pixel Po (or outermost pixel region PAo) of the first display module DM1 and the central portion CP of the outermost pixel Po (or outermost pixel region PAo) of the third display module DM3 may be the same as or smaller than the first interval D1 between two adjacent pixels respectively disposed in the first display module DM1 and the third display module DM3.

Therefore, since the interval D2+D2 between the central portions CP of the outermost pixels Po (or outermost pixel region PAo) of two adjacent display modules DM1, DM2, DM3 and DM4 in which sides are connected with (or in contact with) each other along the first direction X and the second direction Y are the same as or smaller than the first interval D1 between two adjacent pixels respectively disposed in the display modules DM1, DM2, DM3 and DM4, there is no boundary portion or seam between two adjacent display modules DM1, DM2, DM3 and DM4, whereby a dark portion due to the boundary portion provided between the plurality of display modules DM1, DM2, DM3 and DM4 does not exist. As a result, the image displayed on the multi-screen display apparatus, in which each of the plurality of display modules DM1, DM2, DM3 and DM4 is tiled in the form of 2×2, may be displayed continuously without disconnection (or discontinuity) in the boundary portion between the plurality of display modules DM1, DM2, DM3 and DM4.

In FIGS. 10 and 11, the plurality of display modules DM1, DM2, DM3 and DM4 may be tiled to have a 2×2 shape, but are not limited thereto, and the plurality of display modules DM1, DM2, DM3 and DM4 may be tiled to have a shape of xX1, a shape of 1Xy or a shape of xXy, wherein x may be a natural number of 2 or more, which is equal to y, and y may be a natural number of 2 or more, which is greater than or smaller than x.

As described above, in the multi-screen display apparatus according to the present disclosure, when the display portion AA of each of the plurality of display modules DM1, DM2, DM3 and DM4 is displayed as a single image on one screen, an image continuously connected without being disconnected in the boundary portion between the plurality of display modules DM1, DM2, DM3 and DM4 may be displayed. As a result, image immersion of a viewer who views an image displayed on the multi-screen display apparatus may be improved.

The display apparatus according to one embodiment of the present disclosure may be applied to all of electronic devices that include a display panel. For example, the display apparatus according to the present disclosure may be applied to a mobile device, a video phone, a smart watch, a watch phone, a wearable device, a foldable device, a rollable device, a bendable device, a flexible device, a curved device, an electronic diary, electronic book, a portable multimedia player (PMP), a personal digital assistant (PDA), an MP3 player, a mobile medical device, a desktop PC, a laptop PC, a netbook computer, a workstation, a navigator, a vehicle navigator, a vehicle display device, a television, a wall paper display device, a signage device, a game device, a notebook computer, a monitor, a camera, a camcorder, home appliances, etc.

According to the present disclosure, the following advantageous effects may be obtained.

According to some embodiments of the present disclosure, the display apparatus capable of preventing non-uniform luminance of an image from occurring and the multi-screen display apparatus including the same may be provided.

According to some embodiments of the present disclosure, the display apparatus having no bezel and the multi-screen display apparatus including the same may be provided.

According to some embodiments of the present disclosure, the multi-screen display apparatus capable of displaying an image without a sense of disconnection may be provided.

It will be apparent to those skilled in the art that the present disclosure described above is not limited by the above-described embodiments and the accompanying drawings and that various substitutions, modifications and variations can be formed in the present disclosure without departing from the spirit or scope of the disclosures. Consequently, the scope of the present disclosure is intended to cover all variations or modifications derived from the meaning, scope and equivalent concept described within the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display apparatus, comprising:
a substrate having a display portion;
a plurality of pixels disposed in the display portion;
a common electrode disposed in the display portion and electrically connected to each of the plurality of pixels;
an auxiliary electrode electrically connected to an auxiliary voltage line extended from an edge portion of the substrate to the display portion;
a height control layer provided between the substrate and the auxiliary electrode; and
an auxiliary electrode contact portion disposed between the plurality of pixels, wherein the common electrode is in contact with the auxiliary electrode covering a side of the height control layer in the auxiliary electrode contact portion.

2. The display apparatus of claim 1, wherein the auxiliary electrode contact portion includes a first auxiliary contact portion and a second auxiliary contact portion, which are disposed to be spaced apart from each other,
wherein the first auxiliary contact portion is positioned to be higher than the second auxiliary contact portion, and
wherein the common electrode is in contact with the auxiliary electrode in the first auxiliary contact portion.

3. The display apparatus of claim 2, wherein a portion of the auxiliary electrode is exposed in the first auxiliary contact portion, and
wherein the common electrode is in contact with the auxiliary electrode exposed in the first auxiliary contact portion.

4. The display apparatus of claim 1, wherein the height control layer is disposed on a buffer layer on the substrate,
wherein the auxiliary electrode is exposed in the auxiliary electrode contact portion to cover the side of the height control layer, and
wherein the common electrode is in contact with an auxiliary electrode covering the side of the height control layer.

5. The display apparatus of claim 4, wherein the auxiliary electrode includes:
a first auxiliary electrode disposed on an upper surface of the height control layer; and
a second auxiliary electrode disposed on an upper surface of the first auxiliary electrode, covering the side of the height control layer,
wherein the first auxiliary electrode is made of a metal material, and
wherein the second auxiliary electrode is made of a transparent conductive material.

6. The display apparatus of claim 5, wherein the second auxiliary electrode covers a side of the first auxiliary electrode in the first auxiliary contact portion.

7. The display apparatus of claim 1, wherein the common electrode includes at least one of Mg and Ag.

8. The display apparatus of claim 2, further comprising a spaced portion provided between the first auxiliary contact portion and the second auxiliary contact portion,
wherein the common electrode is disconnected in the spaced portion, and
wherein an end of the common electrode disconnected in the spaced portion is in contact with the auxiliary electrode covering the side of the height control layer.

9. The display apparatus of claim 8, further comprising an organic light emitting layer disposed below the common electrode,
wherein the organic light emitting layer is disconnected in the spaced portion, and
wherein the common electrode disposed on the organic light emitting layer disconnected in the spaced portion is in contact with the auxiliary electrode.

10. The display apparatus of claim 6, further comprising an auxiliary layer disposed between the buffer layer and the height control layer,
wherein the common electrode is in contact with the second auxiliary electrode covering the side of the first auxiliary electrode, the side of the height control layer and a side of the auxiliary layer.

11. The display apparatus of claim 4, further comprising:
a passivation layer disposed on the auxiliary electrode; and
a dummy electrode disposed on the passivation layer,
wherein the dummy electrode is more protruded than the passivation layer in the auxiliary electrode contact portion to overlap the auxiliary electrode covering the side of the height control layer.

12. The display apparatus of claim 11, further comprising:
an organic light emitting layer disposed on the dummy electrode,
wherein the common electrode disposed on the organic light emitting layer is not in contact with a side of the passivation layer.

13. The display apparatus of claim 11, further comprising a planarization layer disposed between the passivation layer and the dummy electrode.

14. The display apparatus of claim 4, further comprising:
a passivation layer disposed on the auxiliary electrode;
a planarization layer disposed on the passivation layer;
a bank layer covering the dummy electrode disposed on the planarization layer; and
an organic light emitting layer disposed on the bank layer,
wherein the common electrode covers the organic light emitting layer and is disconnected at a side of the bank layer or a side of the planarization layer.

15. The display apparatus of claim 14, wherein at least a portion of the side of the planarization layer is exposed in the auxiliary electrode contact portion, and
wherein the exposed side of the planarization layer is at an angle of 70° or more with respect to an upper surface of the passivation layer.

16. The display apparatus of claim 1, wherein a side of the display portion is aligned on an outer side of the substrate or a size of the display portion is the same as that of the substrate.

17. The display apparatus of claim 16, wherein an outermost pixel of the plurality of pixels includes a pad portion connected to at least one auxiliary voltage line, and
wherein the plurality of pixels are disposed on the substrate to have a pixel pitch along a first direction and a second direction crossing the first direction, and an interval between a central portion of the outermost pixel and the outer side of the substrate is a half or less of the pixel pitch.

18. A multi-screen display apparatus, comprising:
a plurality of display modules disposed along at least one of a first direction and a second direction crossing the first direction,
wherein each of the plurality of display modules includes a display apparatus, comprising:
a substrate having a display portion;
a plurality of pixels disposed in the display portion;
a common electrode disposed in the display portion and electrically connected to each of the plurality of pixels;
an auxiliary electrode electrically connected to an auxiliary voltage line extended from an edge portion of the substrate to the display portion;
a height control layer provided between the substrate and the auxiliary electrode; and
an auxiliary electrode contact portion disposed between the plurality of pixels,
wherein the common electrode is in contact with the auxiliary electrode covering a side of the height control layer in the auxiliary electrode contact portion.

19. The multi-screen display apparatus of claim 18, wherein a side of the display portion is aligned on outer side of the substrate or a size of the display portion is the same as that of the substrate.

20. The multi-screen display apparatus of claim 19, wherein an outermost pixel of the plurality of pixels includes a pad portion connected to at least one auxiliary voltage line, and the plurality of pixels are disposed on the substrate to have a pixel pitch along the first direction and the second direction crossing the first direction, and an interval between a central portion of the outermost pixel and the outer side of the substrate is a half or less of the pixel pitch.

* * * * *